(12) United States Patent
Sakai et al.

(10) Patent No.: US 9,699,912 B2
(45) Date of Patent: Jul. 4, 2017

(54) WIRING BOARD

(71) Applicant: SHINKO ELECTRIC INDUSTRIES CO., LTD., Nagano (JP)

(72) Inventors: Toyoaki Sakai, Nagano (JP); Tomoyuki Shimodaira, Nagano (JP); Shunichiro Matsumoto, Nagano (JP); Kentaro Kaneko, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/097,473

(22) Filed: Apr. 13, 2016

(65) Prior Publication Data

US 2016/0316560 A1 Oct. 27, 2016

(30) Foreign Application Priority Data

Apr. 22, 2015 (JP) ................. 2015-087966

(51) Int. Cl.
| | |
|---|---|
| H05K 1/09 | (2006.01) |
| H05K 1/03 | (2006.01) |
| H05K 1/16 | (2006.01) |
| H05K 1/11 | (2006.01) |
| H05K 7/10 | (2006.01) |
| H05K 7/00 | (2006.01) |
| H05K 3/00 | (2006.01) |
| H05K 3/46 | (2006.01) |
| H05K 1/14 | (2006.01) |
| H05K 3/34 | (2006.01) |

(52) U.S. Cl.
CPC ........... *H05K 3/007* (2013.01); *H05K 3/4682* (2013.01); *H05K 3/4694* (2013.01); *H05K 1/144* (2013.01); *H05K 3/3436* (2013.01); *H05K 2201/0191* (2013.01)

(58) Field of Classification Search
CPC ...... H05K 3/007; H05K 1/144; H05K 3/3436; H05K 3/4682; H05K 3/4694; H05K 2201/0191
USPC ........ 174/251, 255, 257, 260, 261; 361/767, 361/777
See application file for complete search history.

(56) References Cited

U.S. PATENT DOCUMENTS

| | | | |
|---|---|---|---|
| 6,133,534 A * | 10/2000 | Fukutomi | G01R 1/07314 174/257 |
| 7,397,000 B2 | 7/2008 | Shimoto et al. | |
| 2008/0266823 A1* | 10/2008 | Tseng | H05K 1/111 361/767 |
| 2011/0220397 A1* | 9/2011 | Mizukoshi | H05K 1/142 174/251 |
| 2014/0183751 A1* | 7/2014 | Yoshioka | G11B 5/486 257/773 |

(Continued)

FOREIGN PATENT DOCUMENTS

JP 2005-327780 11/2005

*Primary Examiner* — Sherman Ng
(74) *Attorney, Agent, or Firm* — IPUSA, PLLC

(57) ABSTRACT

A wiring board includes an insulating layer; and a wiring layer embedded in the insulating layer at one surface side of the insulating layer, one surface of the wiring layer being exposed from one surface of the insulating layer, the wiring layer including a first portion and a second portion whose width is wider than that of the first portion, one surface of the first portion and one surface of the second portion being flush with each other, and the first portion being thinner than the second portion.

19 Claims, 17 Drawing Sheets

(56) References Cited

U.S. PATENT DOCUMENTS

2014/0338957 A1* 11/2014 Wang ................ H01L 23/49827
174/251
2014/0347837 A1* 11/2014 Kariya ................ H05K 3/4682
361/767

* cited by examiner

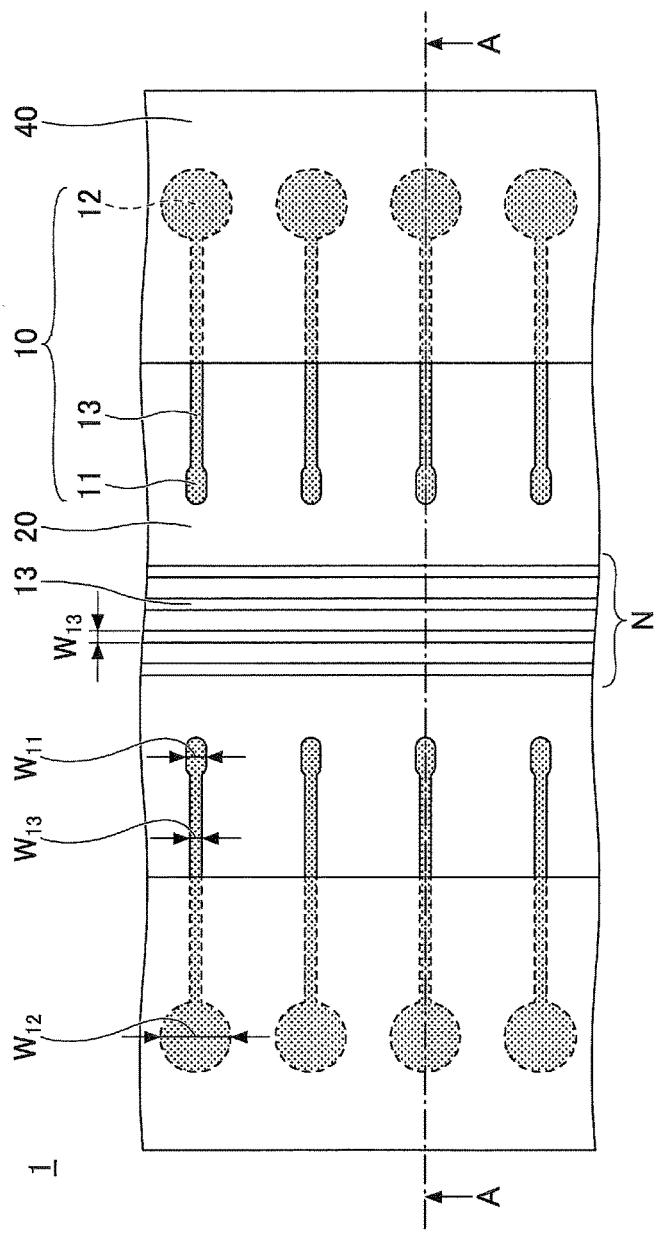
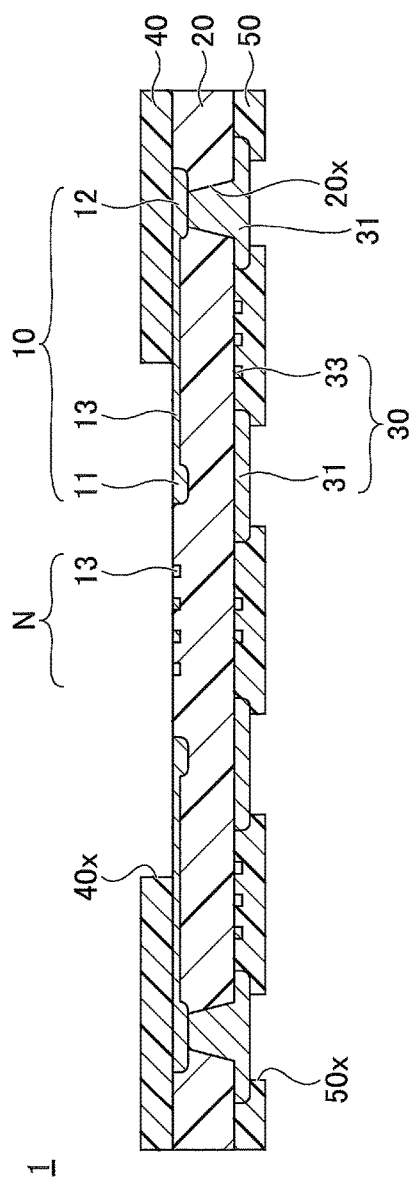
FIG.1A
FIG.1B

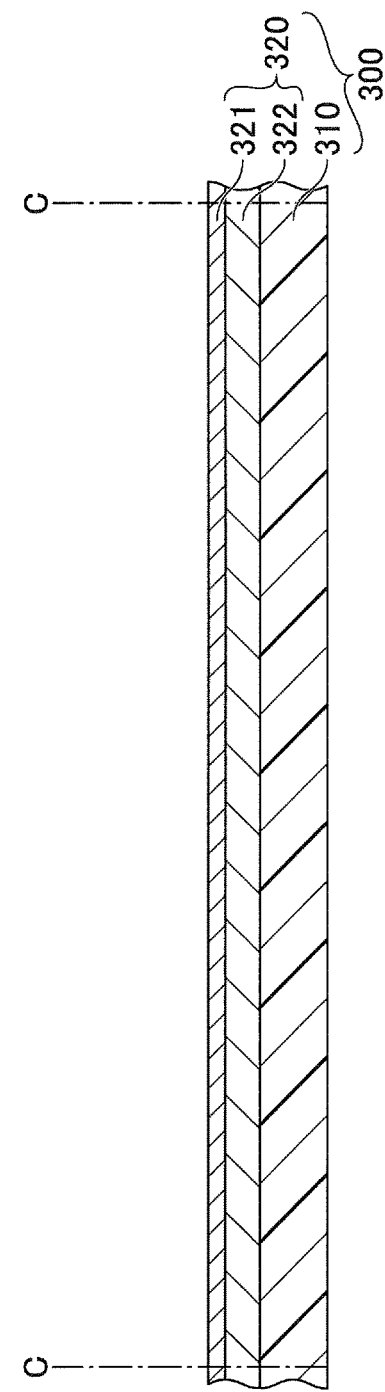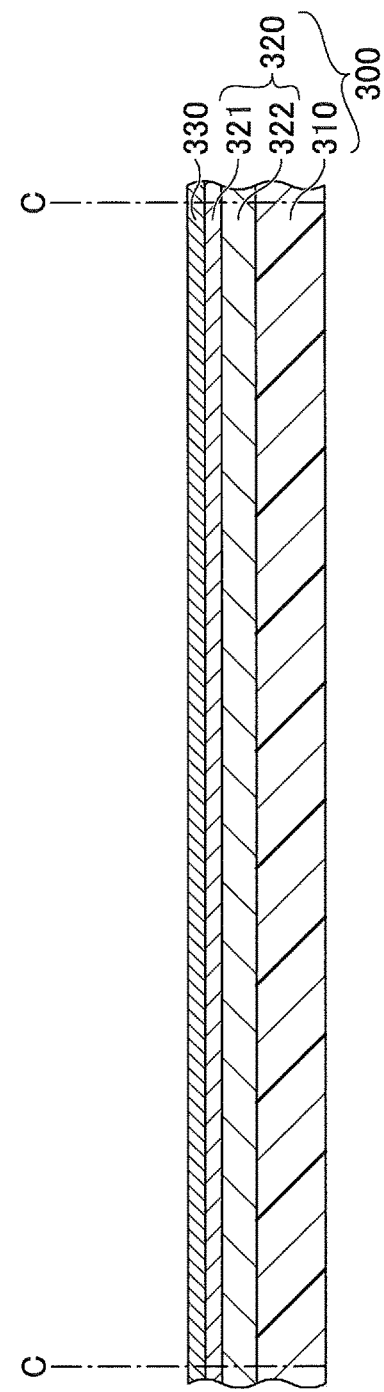

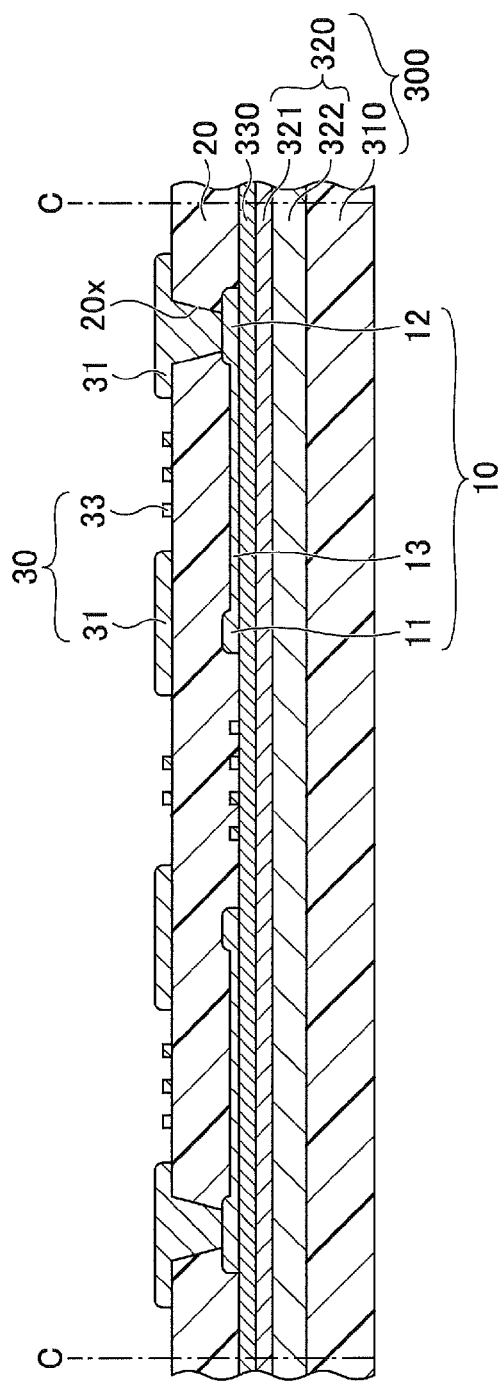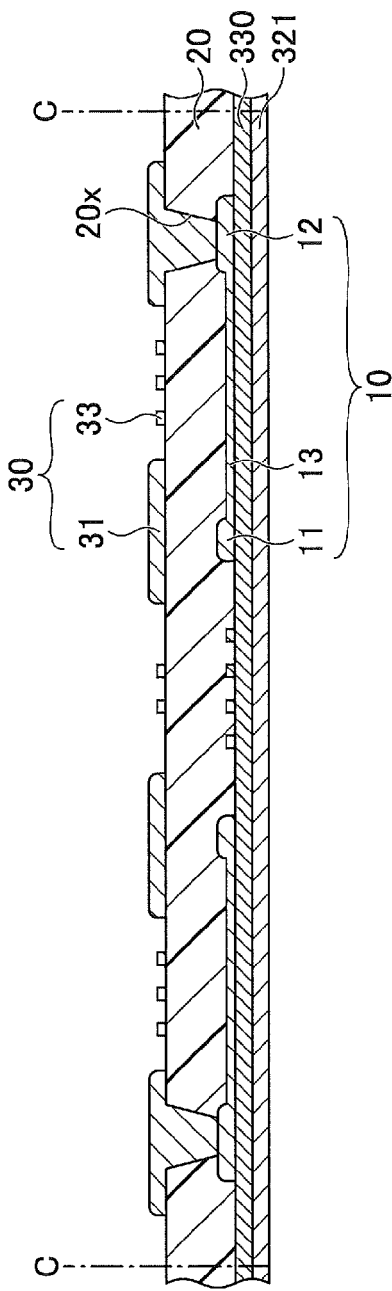
FIG.3C
FIG.3D

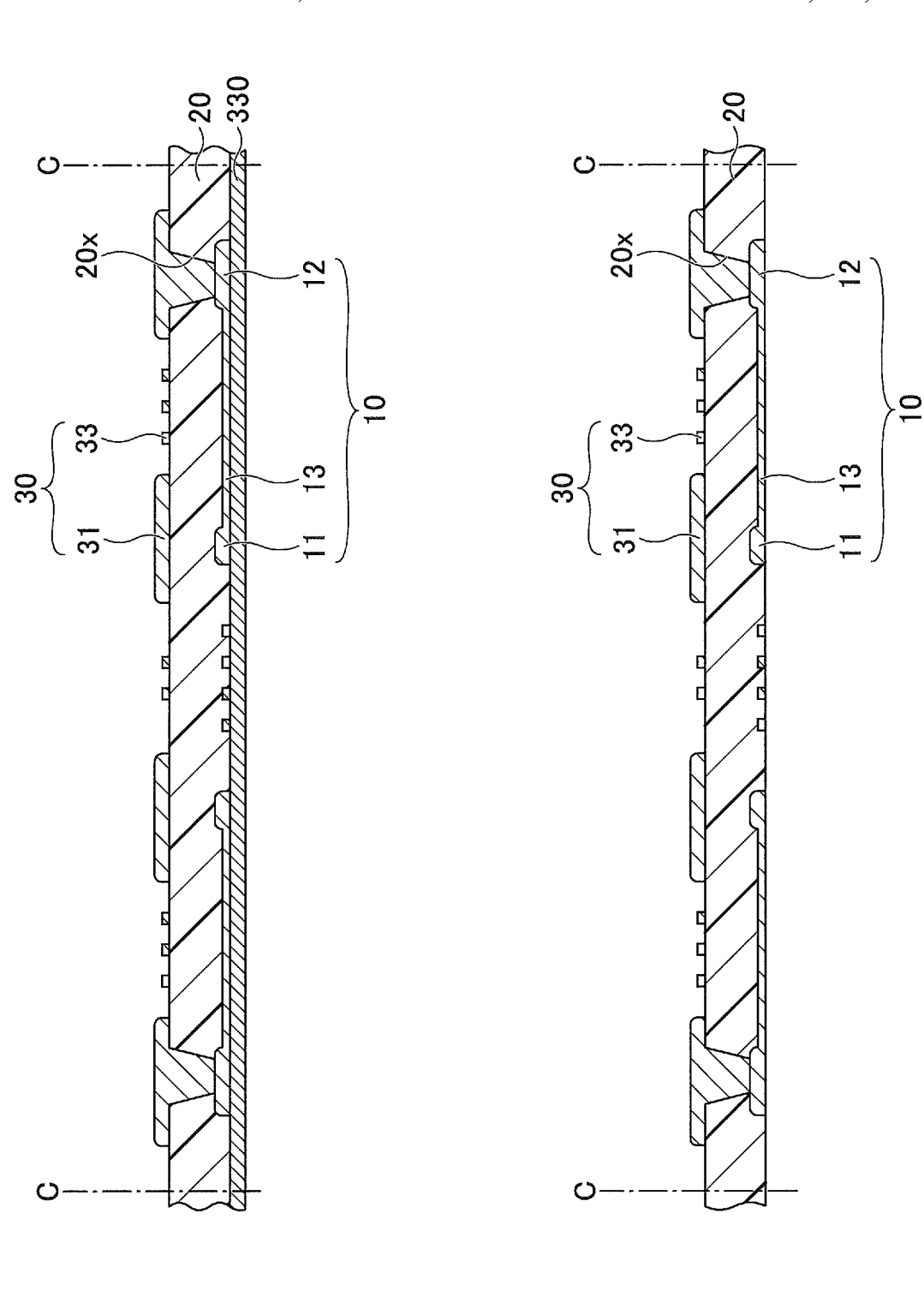

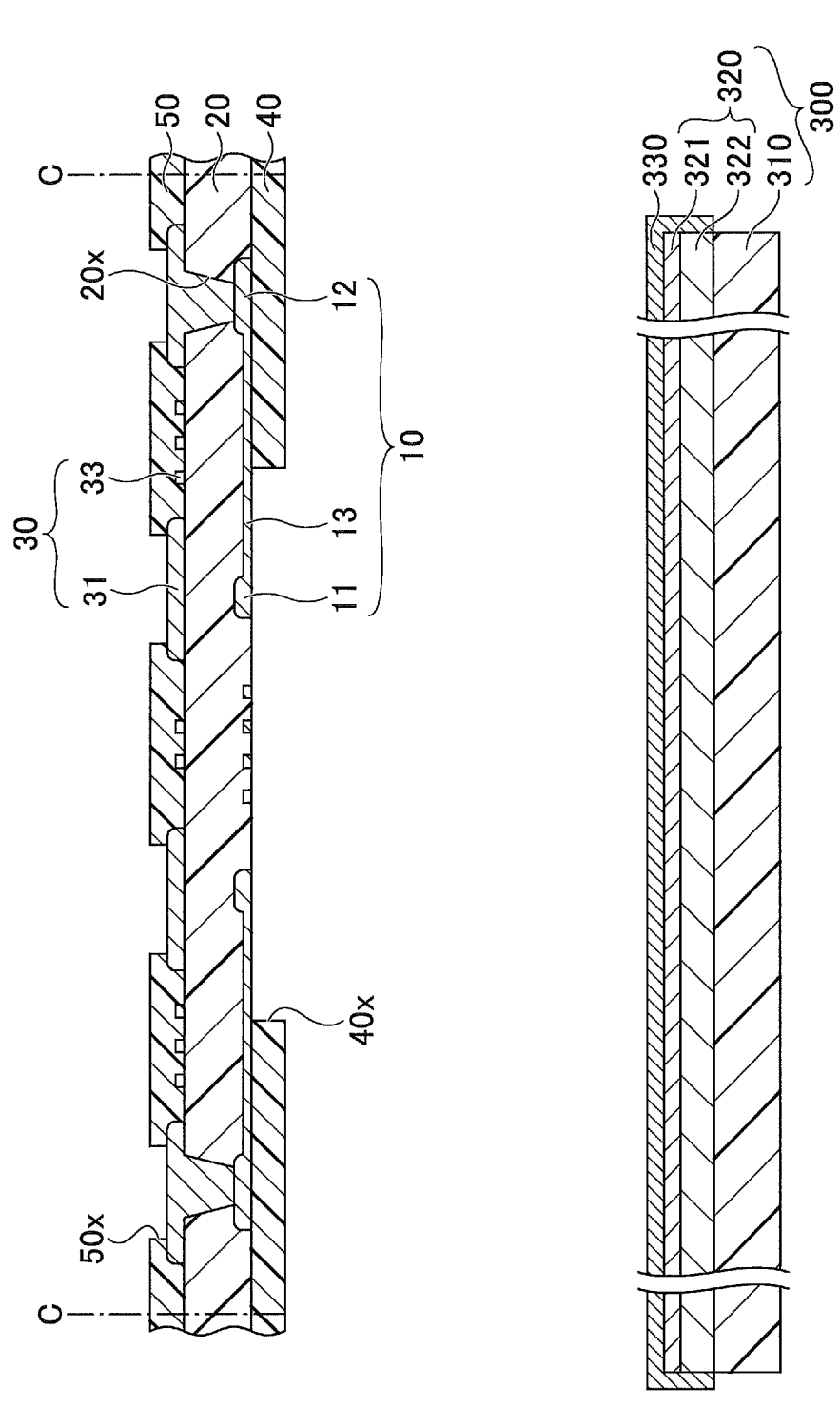

000# WIRING BOARD

CROSS-REFERENCE TO RELATED APPLICATION

The present application is based on and claims the benefit of priority of Japanese Priority Application No. 2015-087966 filed on Apr. 22, 2015, the entire contents of which are hereby incorporated by reference.

BACKGROUND OF THE INVENTION

1. Field of the Invention

The present invention relates to a wiring board.

2. Description of the Related Art

Conventionally, a so-called build-up wiring board is known in which wiring layers and insulating layers are alternately stacked, and the wiring layers are connected with each other through via holes that penetrate the insulating layers. In such a wiring board, the wiring layer is formed by forming a resist layer provided with open portions, depositing copper with a certain thickness in each of the open portions by electroplating or the like and removing the resist layer, for example (see Patent Document 1, for example).

However, in some of the wiring layers, a portion in which narrow wiring patterns are provided (portion whose line/space is narrow) and a portion in which wide wiring patterns are provided (portion whose line/space is wide) are mixed.

Further, the thickness of the resist pattern used for forming the wiring layer is the same at any portions of the wiring layer. This means that even though wiring patterns or various lines/spaces exist in one of the wiring layers, the thickness of the resist pattern is the same for all of the various wiring patterns regardless of the lines/spaces.

Thus, when the thickness of the resist pattern is the same for the narrow wiring patterns and the wide wiring patterns, an aspect ratio (a ratio of the thickness with respect to the width) of the resist pattern becomes relatively high at the narrow wiring patterns compared with that at the wide wiring patterns. Further, the resist pattern at the narrow wiring patterns is formed with a relatively narrow pitch.

The resist pattern is peeled by having peeling solution containing sodium hydroxide or the like absorbed by the resist pattern to be swollen. By having the resist pattern swollen, mechanical distortion due to volume expansion is generated in the resist pattern and the resist pattern is peeled.

Thus, compared with a portion of the resist pattern whose aspect ratio is low, it is difficult to remove a portion of the resist pattern whose aspect ratio is high. At the portion whose aspect ratio is high, there exists a resist pattern with a narrow pitch and high aspect ratio by being interposed between wiring patterns with a narrow pitch and high aspect ratio. Thus, at this portion, the volume of the resist pattern interposed between adjacent wiring patterns becomes relatively small, and the volume expansion amount in accordance with the absorption of the peeling solution and swelling is reduced.

Thus, the mechanical distortion amount of the resist pattern is reduced and defect in peeling tends to occur. Further, the dimension of the side surfaces of the resist pattern interposed between the adjacent wiring patterns are also increased, and defect in peeling further tends to occur. This tendency becomes significant as the resist pattern becomes to have a narrow pitch and high aspect ratio.

PATENT DOCUMENT

[Patent Document 1] Japanese Patent No. 4,108,643

SUMMARY OF THE INVENTION

The present invention is made in light of the above problems, and provides a wiring board in which defect in peeling of a resist layer hardly occurs.

According to an embodiment, there is provided a wiring board including an insulating layer; and a wiring layer embedded in the insulating layer at one surface side of the insulating layer, one surface of the wiring layer being exposed from one surface of the insulating layer, the wiring layer including a first portion and a second portion whose width is wider than that of the first portion, one surface of the first portion and one surface of the second portion being flush with each other, and the first portion being thinner than the second portion.

BRIEF DESCRIPTION OF THE DRAWINGS

Other objects, features and advantages of the present invention will become more apparent from the following detailed description when read in conjunction with the accompanying drawings.

FIG. 1A and FIG. 1B are views illustrating an example of a wiring board of a first embodiment;

FIG. 2A to FIG. 2D are views (No. 1) illustrating an example of manufacturing steps of the wiring board of the first embodiment;

FIG. 3A to FIG. 3D are views (No. 2) illustrating an example of the manufacturing steps of the wiring board of the first embodiment;

FIG. 4A to FIG. 4C are views (No. 3) illustrating an example of the manufacturing steps of the wiring board of the first embodiment;

FIG. 5 is a view (No. 4) illustrating an example of the manufacturing steps of the wiring board of the first embodiment;

DETAILED DESCRIPTION OF THE PREFERRED EMBODIMENTS

Figure 2C:
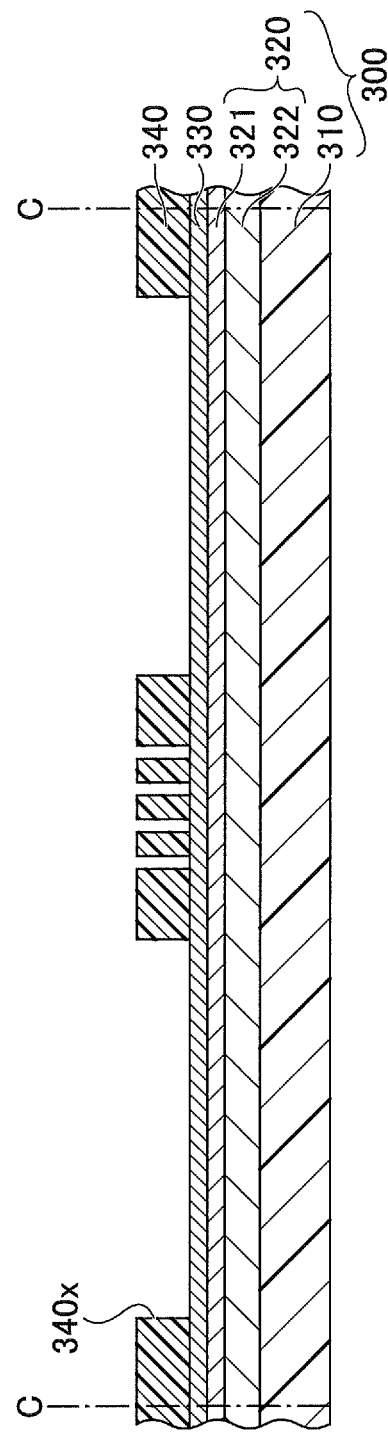

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment (Structure of Wiring Board of First Embodiment)

First, a structure of a wiring board of a first embodiment is described. FIG. 1A and FIG. 1B are views illustrating an example of a wiring board 1 of the first embodiment, wherein FIG. 1A is a partial plan view and FIG. 1B is a cross-sectional view of FIG. 1A taken along an A-A line.

With reference to FIG. 1A and FIG. 1B, the wiring board 1 is a coreless build-up wiring board that includes a wiring layer 10, an insulating layer 20, a wiring layer 30 and solder resist layers 40 and 50. In FIG. 1A, a wiring layer 10 is illustrated by a satin pattern (dotted pattern) for explanation.

In this embodiment, a solder resist layer 40 side of the wiring board 1 is referred to as an upper side or one side, and a solder resist layer 50 side of the wiring board 1 is referred to as a lower side or the other side. Further, a surface of each component at the solder resist layer 40 side is referred to as an upper surface or one surface, and a surface at the solder resist layer 50 side is referred to as a lower surface or the other surface. However, the wiring board 1 may be used in an opposite direction or may be used at an arbitrary angle. Further, in this embodiment, "in a plan view" means that an object is seen in a direction that is normal to the one surface of the solder resist layer 40, and a "plan shape" means a shape of an object seen in the direction that is normal to the one surface of the solder resist layer 40.

In the wiring board 1, the wiring layer 10 is embedded in the insulating layer 20 at one surface side (upper surface side). An upper surface of the wiring layer 10 is exposed at the upper surface of the insulating layer 20, and a lower surface and a side surface of the wiring layer 10 is covered by the insulating layer 20. The upper surface of the wiring layer 10 may be flush with the upper surface of the insulating layer 20, for example. The wiring layer 10 may be composed of a single metal layer, and for the material of the wiring layer 10, copper (Cu) or the like may be used, for example. The wiring layer 10 includes pads 11 for external connection that are connected to a semiconductor chip or the like, pads 12 for receiving a via each being connected to an end portion of a respective via wiring of the wiring layer 30, and wiring patterns 13. The pads 11 may be connected to the pads 12 via the wiring patterns 13, respectively.

In this embodiment, the wiring layer 10 includes a narrow portion (first portion) and a wide portion (second portion) whose width is wider than the narrow portion. In this embodiment, the narrow portion is formed to be thinner than the wide portion (this may be the same for other wiring layers). Although whether the width is narrow or wide may be determined in accordance with a specification of each of the wiring boards, in this embodiment, it is assumed that when the width is less than or equal to 15 μm, it is referred to as a narrow portion, and when the width is greater than 15 μm, it is referred to as a wide portion, for example. The width means a diameter when the plan shape of the portion is a circle, a shorter diameter when the plan shape of the portion is an ellipse, and a shorter length when the plan shape of the portion is a rectangle.

The pads 11 and 12 are the wide portions, and the wiring patterns 13 are the narrow portion. The width $W_{11}$ of the pad 11 may be about 25 μm, for example. The space between the adjacent pads 11 may be about the same as the width $W_{11}$ of the pad 11, for example. The width $W_{12}$ of the pad 12 may be about 80 μm, for example. The space between the adjacent pads 12 may be about the same as the width $W_{12}$ of the pad 12, for example. The thickness of each of the pads 11 and 12 may be about 15 μm, for example.

The width $W_{13}$ of the wiring pattern 13 may be about 10 μm, for example. The space between the adjacent wiring patterns 13 may be about the same as the width $W_{11}$ of the wiring pattern 13, for example. Further, the thickness of the wiring pattern 13 may be about 12 μm, for example.

Among the wiring patterns 13, for the wiring patterns 13 that are provided at a center portion N in FIG. 1A and FIG. 1B, the wiring patterns 13 are close to each other with a narrow pitch, and are formed as a particularly narrow line/space portion. In this embodiment, the particularly narrow line/space portion means portions whose line/space is less than or equal to 8 μm/8 μm. It is possible to form wiring patterns whose line/space is about greater than or equal to 1 μm/1 μm and less than or equal to 3 μm/3 μm as the particularly narrow line/space portion. Here, the line of line/space expresses a wiring width, and the space of line/space expresses a space between the adjacent wirings (wiring space). For example, when it is described as line/space=8 μm/8 μm, this means that the wiring width is 8 μm and the space between the adjacent wirings is 8 μm.

Upper surfaces of the pads 11, upper surfaces of the pads 12 and upper surfaces of the wiring patterns 13 are flush with each other. This means that although the pads 11 and 12 and the wiring patterns 13 have different thicknesses, the surfaces that are exposed from the insulating layer 20 are flush with each other, and the pads 11 and 12 and the wiring patterns 13 are formed to have steps at an inner side of the insulating layer 20.

The insulating layer 20 is a layer at which the wiring layer 10 and the wiring layer 30 are formed. For the material of the insulating layer 20, thermosetting insulating resin containing epoxy-based resin, imide-based resin, phenol-based resin, cyanate-based resin or the like as a main constituent may be used, for example. The thermosetting insulating resin used as the insulating layer 20 may be non-photosensitive insulating resin or photosensitive insulating resin. Further, the insulating layer 20 may include a reinforcement member composed of a woven fabric or a nonwoven fabric such as a glass fiber, an aramid fiber or the like. Further, the insulating layer 20 may include filler such as silica ($SiO_2$) or the like. The thickness of the insulating layer 20 may be about 10 to 50 μm, for example.

The wiring layer 30 is formed at a lower surface side of the insulating layer 20. For the material of the wiring layer 30, copper (Cu) or the like may be used, for example. The wiring layer 30 includes pads 31 for external connection that are connected to another wiring board or the like, and wiring patterns 33. The pads 31 may be connected to the wiring patterns 33, respectively. Each of the pads 31 may be connected to the respective pad 12 through a via wiring that is filled in a via hole 20x that penetrates the insulating layer 20 and exposes the lower surface of the respective pad 12. Each of the via holes 20x is a concave portion having a cone trapezoid shape where the diameter of an open portion at a solder resist layer 50 side is larger than the diameter of a bottom portion of an open portion formed by the lower surface of the pad 12. The pad 31 and the via wiring in the via hole 20x are integrally formed.

The pads 31 are the wide portions (fourth portion), and the width of the pad 31 may be about 150 μm, for example. The thickness of the pad 31 may be about 15 μm, for example. The wiring patterns 33 (third portion) are the narrow portions, and the width of the wiring pattern 33 may be about 10 μm, for example. Further, the thickness of the wiring pattern 33 may be about 12 μm, for example. The wiring layer 30 may include pads for receiving a via each being connected to the respective wiring pattern 33 and connected to the respective pad 12 through a via.

The solder resist layer 40 is formed at the upper surface of the insulating layer 20 so as to cover the wiring layer 10. The solder resist layer 40 is provided with an open portion 40x, and a part of the wiring layer 10 (the pads 11 and a part of the wiring patterns 13, for example) is exposed at a bottom portion of the open portion 40x. The solder resist layer 50 is formed at the lower surface of the insulating layer 20 so as to cover the wiring layer 30. The solder resist layer 50 is provided with open portions 50x, and the lower surfaces of the pads 31 of the wiring layer 30 are exposed at bottom portions of the open portions 50x, respectively. For the material of each of the solder resist layers 40 and 50, photosensitive epoxy-based insulating resin, acrylic-based insulating resin or the like may be used, for example. The thickness of each of the solder resist layers 40 and 50 may be about 5 to 40 μm, for example.

In accordance with necessity, metal layers may be formed on the upper surface of the wiring layer 10 that is exposed from the open portion 40x and the lower surface of the wiring layer 30 that is exposed from the open portions 50x, respectively. For the example of the metal layer, an Au layer, a Ni/Au layer (a metal layer in which a Ni layer and an Au layer are stacked in this order), a Ni/Pd/Au layer (a metal layer in which a Ni layer, a Pd layer and an Au layer are stacked in this order) or the like may be used. Alternatively, instead of forming the metal layer, an antioxidation process such as an Organic Solderability Preservative (OSP) process or the like may be performed. A surface treatment layer formed by the OSP process is an organic coating made of an azole compound, an imidazole compound or the like.

(Method of Manufacturing Wiring Board of First Embodiment)

Next, a method of manufacturing the wiring board of the first embodiment is described. FIG. 2A to FIG. 5 are views illustrating an example of manufacturing steps of the wiring board 1 of the first embodiment. Although an example of manufacturing steps in which a part corresponding to a plurality of wiring boards is firstly manufactured on a support body, and after removing the support body, the plurality of wiring boards are obtained by individualizing the part is described in this embodiment, manufacturing steps in which each single wiring board is manufactured on the support body, and then the support body is removed may be alternatively used.

First, in a step illustrated in FIG. 2A, a support body 300 whose upper surface is a flat surface is prepared. For the support body 300, a structure in which a metal foil with a carrier 320 is stacked on a pre-preg 310 may be used, for example. The thickness of the support body 300 may be about 18 to 100 μm, for example.

The pre-preg 310 has a structure in which insulating resin such as epoxy-based resin or the like is impregnated in a woven fabric or a nonwoven fabric (not illustrated in the drawings) such as a glass fiber, an aramid fiber or the like, for example. The metal foil with a carrier 320 has a structure in which a thin foil 321 made of copper with a thickness of about 1.5 to 5 μm is detachably stuck on a thick foil (carrier foil) 322 made of copper with a thickness of about 10 to 50 μm through a peeling layer (not illustrated in the drawings). The thick foil 322 is provided as a support material for facilitating handling of the thin foil 321. A lower surface of the thick foil 322 is adhered at an upper surface of the pre-preg 310.

Next, in a step illustrated in FIG. 2B, a barrier layer 330 is formed on an upper surface of the thin foil 321 that constitutes the support body 300 by electroplating or the like using the metal foil with a carrier 320 as a power supply layer, for example. The barrier layer 330 functions as an etching stop layer when removing the thin foil 321 by etching in later steps. For the material of the barrier layer 330, a metal that is not removed by etchant of the thin foil 321 made of copper, such as nickel (Ni) or the like may be used, for example. The thickness of the barrier layer 330 may be about a few μm, for example.

Next, in a step illustrated in FIG. 2C, a resist layer 340 provided with open portions 340x in which the wiring layer 10 is formed is formed on the upper surface of the barrier layer 330. Specifically, a dry film resist composed of photosensitive resin is laminated on the upper surface of the barrier layer 330 as the resist layer 340, for example. Then, the open portions 340x that expose the upper surface of the barrier layer 330 at portions at which the wiring layer 10 is formed are formed by patterning the dry film resist by exposing and developing.

Figure 2D:
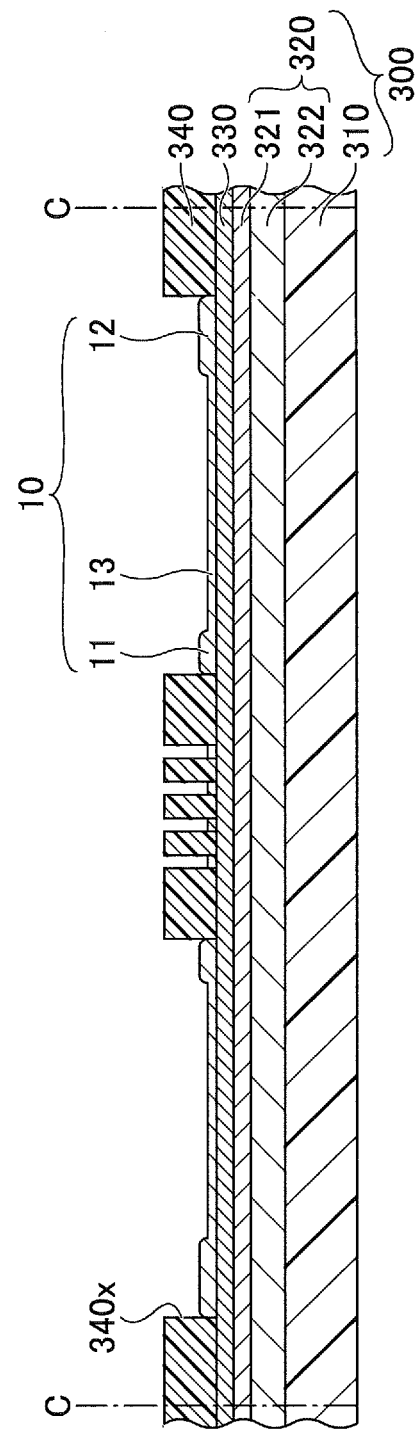

Next, in a step illustrated in FIG. 2D, the wiring layer 10 is formed on the upper surface of the barrier layer 330 that is exposed in each of the open portions 340x of the resist layer 340 by electroplating using the metal foil with a carrier 320 and the barrier layer 330 as a power supply layer. The wiring layer 10 contacts the upper surface of the barrier layer 330 at the one surface and exposes within the open portions 340x at the other surface.

For example, by depositing a copper plating on the support body 300 by using electrolyte copper plating solution prepared with a predetermined concentration ratio of copper sulfate and sulfuric acid, it is possible to form the pads 11 and 12, which are the wide portions, to be thick, and the wiring patterns 13, which are the narrow portions, to be thin. At this time, it is preferable to set the concentration ratio of copper sulfate and sulfuric acid (copper sulfate/sulfuric acid) within a range greater than or equal to 1 and less than or equal to 5 because it is possible to make the wiring patterns 13, each of whose width is narrow, to be particularly thin (see FIG. 11, which will be explained later). Here, examples of specific values of the widths or the thicknesses of each of the pads 11, the pads 12 and the wiring patterns 13 are the same as those explained with reference to FIG. 1A and FIG. 1B.

Figure 3A:
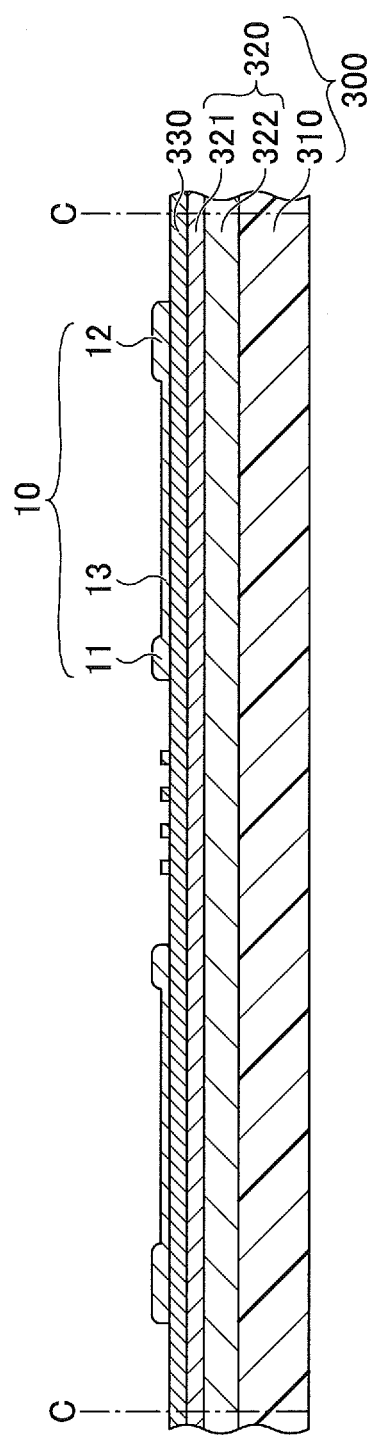

Next, in a step illustrated in FIG. 3A, the resist layer 340 illustrated in FIG. 2D is removed. The resist layer 340 may be peeled by peeling solution containing sodium hydroxide or the like, for example. At this time, if the wiring patterns 13, each of whose width is narrow, are thick, there exists a resist pattern with a narrow pitch and high aspect ratio interposed between the wiring patterns 13 with a narrow pitch and high aspect ratio. Thus, as described above, defect in peeling of the resist pattern easily occurs.

However, in this embodiment, by adjusting the plating condition in the step illustrated in FIG. 2D, the thickness of the wiring patterns 13 can be made thin. Thus, in the resist pattern with a narrow pitch and high aspect ratio interposed between the wiring patterns 13 of a narrow pitch, dimension of a portion of side surfaces of the resist pattern interposed between the adjacent wiring patterns 13 can be decreased.

As a result, even when the mechanical distortion amount of the resist pattern is relatively small, as a contacting dimension between the side surfaces of the resist pattern and the wiring pattern 13 is decreased, the resist pattern can be peeled easily. Thus, occurrence of defect in peeling can be suppressed. This effect is significant for a portion whose line/space is less than or equal to 8 μm/8 μm, for a portion formed as the particularly narrow line/space portion of the wiring patterns 13 (the center portion N in FIG. 1A and FIG. 1B, for example).

Figure 3B:
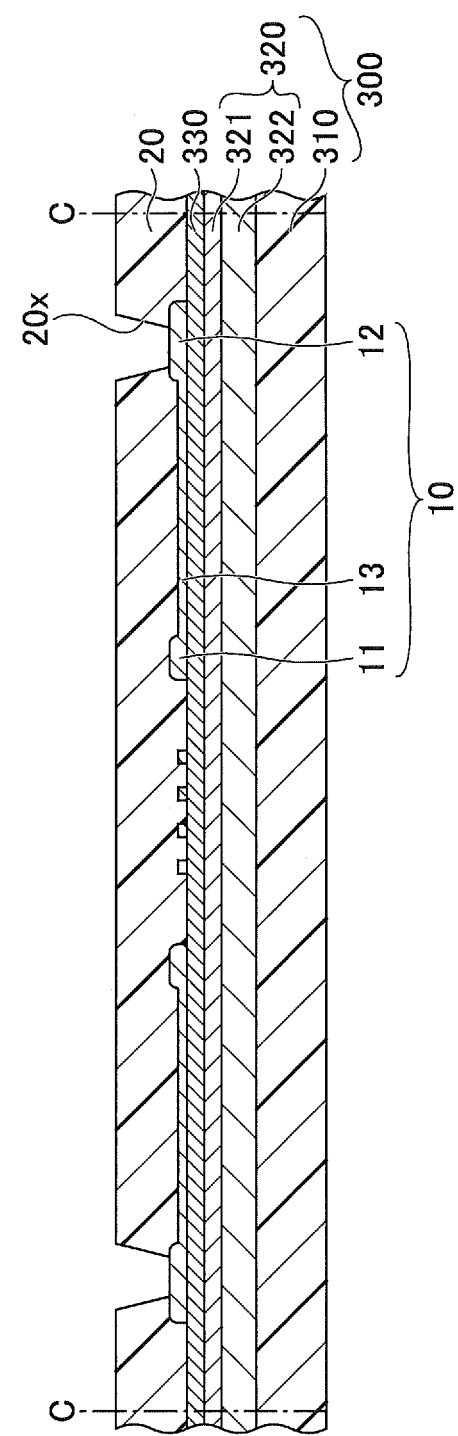

Next, in a step illustrated in FIG. 3B, the insulating layer 20 that covers the other surface and the side surface of the wiring layer 10 is formed on the upper surface of the barrier layer 330, and the via holes 20x that penetrate the insulating layer 20 to expose the other surface of the pads 12, respectively, are formed. Specifically, thermosetting epoxy-based insulating resin in a film form is laminated on the upper surface of the barrier layer 330 so as to cover the wiring layer 10, for example. Alternatively, thermosetting epoxy-based insulating resin in a liquid form or a paste form is coated on the upper surface of the barrier layer 330 by screen printing, spin coating or the like so as to cover the wiring layer 10, for example. Then, the insulating layer 20 is formed by heating the laminated or coated insulating resin to temperature greater than or equal to curing temperature while pressing the insulating resin. If necessary, heating is performed while being pressurized. Here, it is preferable that a roughing treatment is performed on the other surface and the side surface of the wiring layer 10 before forming the insulating layer 20 because the adhesion between the wiring layer 10 and the insulating layer 20 is improved.

Next, the via holes 20x that penetrate the insulating layer 20 and expose the other surfaces of the pads 12, respectively, are formed in the insulating layer 20. The via holes 20x may be formed by a laser processing using $CO_2$ laser or the like, for example. When the via holes 20x are formed by the laser processing, it is preferable to perform a desmear process to remove residue of the resin of the insulating layer 20 that is adhered at the other surface of the pad 12 that is exposed at a bottom portion of each of the via holes 20x. Here, as the pad 12 to which the laser beam is irradiated is made thick, a risk that the laser beam penetrates the pad 12 can be reduced.

Next, in a step illustrated in FIG. 3C, the wiring layer 30 including the pads 31 and the wiring patterns 33 is formed on the insulating layer 20. Some of the pads 31 are connected to the pads 12 through via wirings that are filled in the via holes 20x that penetrate the insulating layer 20 and expose the other surfaces of the pads 12, respectively. The wiring layer 30 may be formed by a semi-additive method, for example.

When forming the wiring layer 30 by the semi-additive method, first, a seed layer (not illustrated in the drawings) made of copper (Cu) or the like is formed by electroless plating or a sputtering method. The seed layer is formed on the entirety of the other surface of the insulating layer 20 including the other surfaces of the pads 12 exposed at bottom portions of the via holes 20x and inner wall surfaces of the via holes 20x, respectively. Further, a resist layer (not illustrated in the drawings) provided with open portions corresponding to the wiring layer 30 are formed on the seed layer. Then, an electrolytic plating layer (not illustrated in the drawings) made of copper (Cu) is formed in the open portions of the resist layer by electroplating using the seed layer as a power supply layer. Subsequently, after removing the resist layer, portions of the seed layer that are not covered by the electrolytic plating layer are removed by etching using the electrolytic plating layer as a mask. With this, the wiring layer 30 in which the electrolytic plating layer is stacked on the seed layer is formed.

At this time, by performing the electroplating under the condition same as the step illustrated in FIG. 2D, the pads 31 can be made as thick as the pads 11 and 12 and the wiring patterns 33 can be made as thin as the wiring patterns 13. As a result, similar to the step illustrated in FIG. 3A, even when the mechanical distortion amount of the resist pattern is relatively small, as a contacting dimension between the side surfaces of the resist pattern and the wiring patterns 33 is decreased, the resist pattern can be easily peeled. Thus, occurrence of defect in peeling can be suppressed.

Next, in a step illustrated in FIG. 3D, a part of the support body 300 is removed from a structural body illustrated in FIG. 3C. Specifically, an interface between the thin foil 321 and the thick foil 322 of the metal foil with a carrier 320 is peeled by applying mechanical force on the support body 300. As described above, as the metal foil with a carrier 320 has a structure in which the thick foil 322 is adhered on the thin foil 321 through the peeling layer (not illustrated in the drawings), the thick foil 322 is easily peeled from the thin foil 321 with the peeling layer (not illustrated in the drawings).

With this, only the thin foil 321 is left at the barrier layer 330 side, and other members (the pre-preg 310 and the thick foil 322) that compose the support body 300 are removed. Here, there may be a case that cohesion failure occurs in the peeling layer and the thick foil 322 is peeled from thin foil 321, in addition to the case in which the thin foil 321 is peeled from the thick foil 322 with the peeling layer. Further, there may be a case that the thick foil 322 is peeled from the thin foil 321 as the thick foil 322 is peeled from the peeling layer.

Next, in a step illustrated in FIG. 4A, the thin foil 321 (see FIG. 3D) made of copper is removed by etching. The thin foil 321 made of copper may be removed by wet etching using hydrogen peroxide/sulfuric acid-based aqueous solution, sodium persulfate aqueous solution, ammonium persulfate aqueous solution or the like, for example. When the barrier layer 330 is made of nickel (Ni), it is not removed by the etchant for copper and the barrier layer 330 functions as the etching stop layer. Thus, the wiring layer 10 is not etched.

Next, in a step illustrated in FIG. 4B, the barrier layer 330 (see FIG. 4A) is removed. When the barrier layer 330 is made of nickel (Ni), it is possible to selectively etch the barrier layer 330 without etching the wiring layer 10 by selecting etchant that removes nickel (Ni) but does not remove copper. With this, the one surface of the wiring layer 10 is exposed at the one surface of the insulating layer 20. The one surface of the wiring layer 10 may be flush with the one surface of the insulating layer 20, for example.

Next, in a step illustrated in FIG. 4C, the solder resist layer 40 that covers the wiring layer 10 is formed on the one surface of the insulating layer 20. Further, the solder resist layer 50 that covers the wiring layer 30 is formed on the other surface of the insulating layer 20. Each of the solder resist layers 40 and 50 is formed by coating insulating resin in a liquid form or a paste form at each surface so as to cover the respective wiring layer 10 or 30 by screen printing, roll coating, spin coating or the like, for example. Alternatively, insulating resin in a film form may be laminated at each surface so as to cover the respective wiring layer 10 or 30. For the insulating resin, photosensitive epoxy-based insulating resin, acrylic-based insulating resin or the like may be used, for example.

Then, by exposing and developing the coated or laminated insulating resin, the open portion 40x that exposes the pads 11 and a part of the wiring patterns 13 of the wiring layer 10 is formed in the solder resist layer 40 (photolithography). Similarly, the open portions 50x that expose the pads 31 of the wiring layer 30, respectively, are formed in the solder resist layer (photolithography). When non-photosensitive insulating resin (thermosetting resin) whose main constituent is epoxy-based resin or polyimide-based resin is used as the material of each of the solder resist layers 40 and 50, the open portions 40x and 50x may be formed by laser processing, blasting or the like.

In accordance with necessity, metal layers may be formed by electroless plating or the like on the one surfaces of the pads 11 and the wiring patterns 13 that are exposed at a bottom portion of the open portion 40x, and on the other surfaces of the pads 31 that are exposed at bottom portions of the open portions 50x, respectively, for example. The example of the metal layer is the same as those described above. Further, an antioxidation process such as an OSP process or the like may be performed on the one surfaces of the pads 11 and the wiring patterns 13 that are exposed at the bottom portion of the open portion 40x, and the other surfaces of the pads 31 that are exposed at the bottom portions of the open portions 50x, respectively.

After the step illustrated in FIG. 4C, a structural body illustrated in FIG. 4C is cut at cut positions C by a slicer or the like to be individualized, and a plurality of the wiring boards 1 are completed (see FIG. 1A and FIG. 1B). In accordance with necessity, terminals for external connection such as solder balls or the like may be provided on the pads 11 that are exposed in the open portion 40x of the solder resist layer 40, and on the pads 31 that are exposed in the open portions 50x of the solder resist layer 50, respectively.

Here, in the step illustrated in FIG. 2B, as illustrated in FIG. 5, the barrier layer 330 may be formed so as to continuously cover the upper surface of the thin foil 321 and the side surface of the metal foil with a carrier 320 (the side surface of the thin foil 321 and the side surface of the thick foil 322) that compose the support body 300. This structure is preferable because accidental peeling of the metal foil with a carrier 320 in the manufacturing steps of the wiring board 1 can be prevented. The steps after FIG. 5 are the same as those of FIG. 2C to FIG. 4C.

As such, in this embodiment, the wiring layer 10 is formed by depositing copper plating on the support body 300 using the electrolyte copper plating solution prepared with the predetermined concentration ratio of copper sulfate and sulfuric acid, for example. With this, the wiring patterns 13, which are the narrow portions, can be made thin, and the pads 11 and 12, which are the wide portions, can be made thick, among the wiring layer 10.

Thus, in the resist pattern with a narrow pitch and high aspect ratio interposed between the wiring patterns 13 of a narrow pitch, dimension of a portion of side surfaces of the resist pattern interposed between the adjacent wiring patterns 13 can be decreased. As a result, even when the mechanical distortion amount of the resist pattern is relatively small, as a contacting dimension between the side surfaces of the resist pattern and the wiring pattern 13 is decreased, the resist pattern can be easily peeled. Thus, occurrence of defect in peeling can be suppressed (this is the same for other wiring layers).

In particular, it is preferable to set concentration ratio of copper sulfate and sulfuric acid (copper sulfate/sulfuric acid) within a range greater than or equal to 1 and less than or equal to 5 because a narrow portion of the wiring patterns 13 can be made particularly thin. In such a case, defect in peeling of the resist layer 340 can be further reduced (this is the same for other wiring layers). Effects of reducing the defect in peeling or the like will be explained more in detail in examples later.

Alternative Example 1 of First Embodiment

In an alternative example 1 of the first embodiment, another example of the method of manufacturing the wiring board 1 is described. In the alternative example 1 of the first embodiment, for the same components that are already described above, descriptions are sometimes not repeated.

FIG. 6A to FIG. 6D are views illustrating an example of the manufacturing method of the wiring board of the alternative example 1 of the first embodiment. In the alternative example 1 of the first embodiment, the barrier layer 330 is not formed on the support body 300.

Figure 6A:
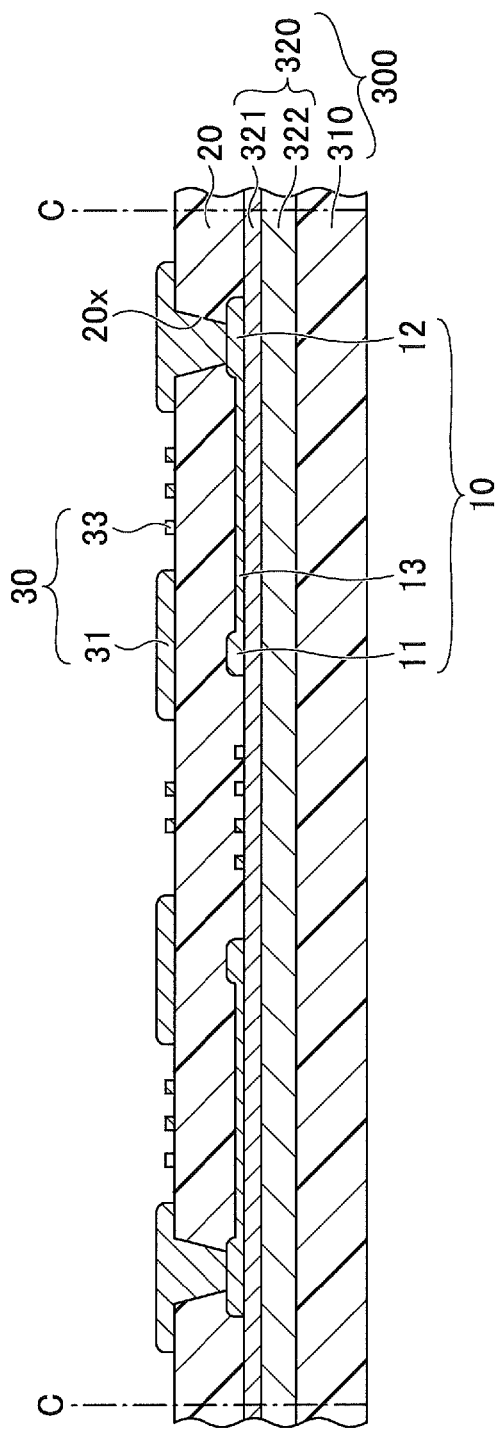
FIG. 6A to FIG. 6D are views illustrating an example of the manufacturing steps of the wiring board of an alternative example 1 of the first embodiment.
Figure 6B:
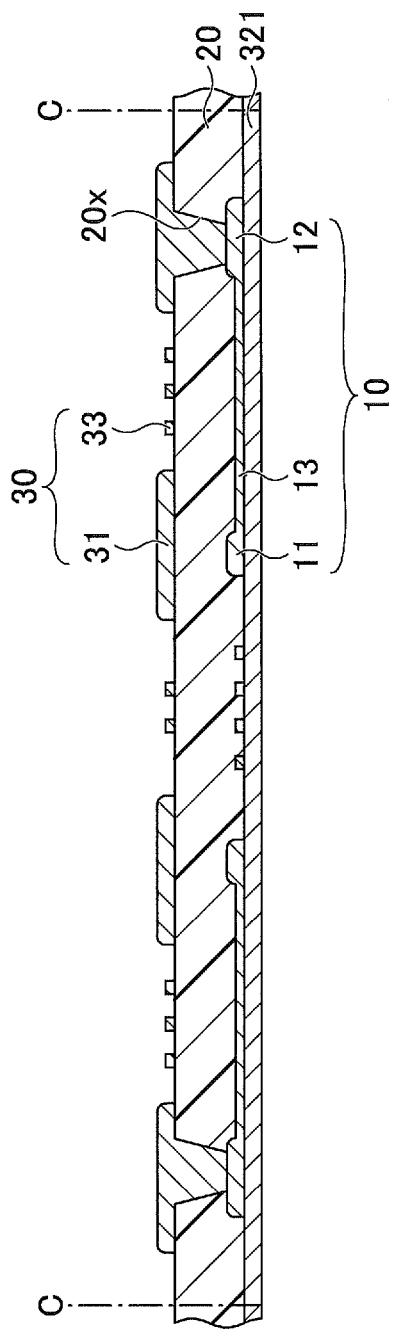

First, in a step illustrated in FIG. 6A, after the step illustrated in FIG. 2A, steps similar to FIG. 2C to FIG. 3C are performed, and the wiring layer 10, the insulating layer 20 and the wiring layer 30 are directly stacked on the support body 300. Next, as illustrated in FIG. 6B, similar to the step illustrated in FIG. 3D, the pre-preg 310 and the thick foil 322 that compose the support body 300 are peeled from a structural body illustrated in FIG. 6A. With this, only the thin foil 321 is left at the insulating layer 20 side, and other members (the pre-preg 310 and the thick foil 322) that compose the support body 300 are removed.

Figure 6C:
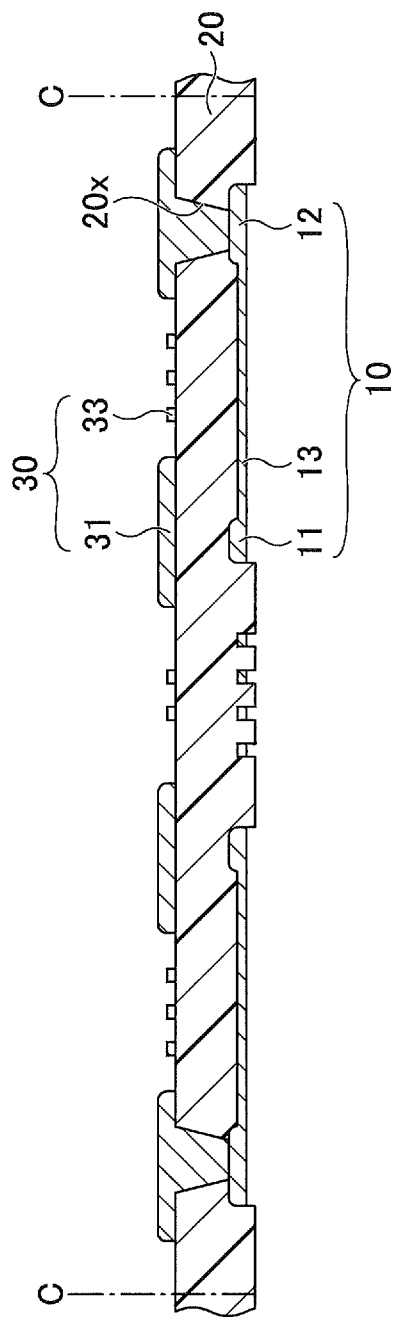

Next, in a step illustrated in FIG. 6C, similar to the step illustrated in FIG. 4A, the thin foil 321 made of copper (see FIG. 6B) is removed by etching. In this embodiment, as the barrier layer 330 that functions as an etching stop layer is not included, the one surface of the wiring layer 10 made of copper is also etched. With this, the one surface of the wiring layer 10 is exposed at position concaved from the one surface of the insulating layer 20.

Figure 6D:
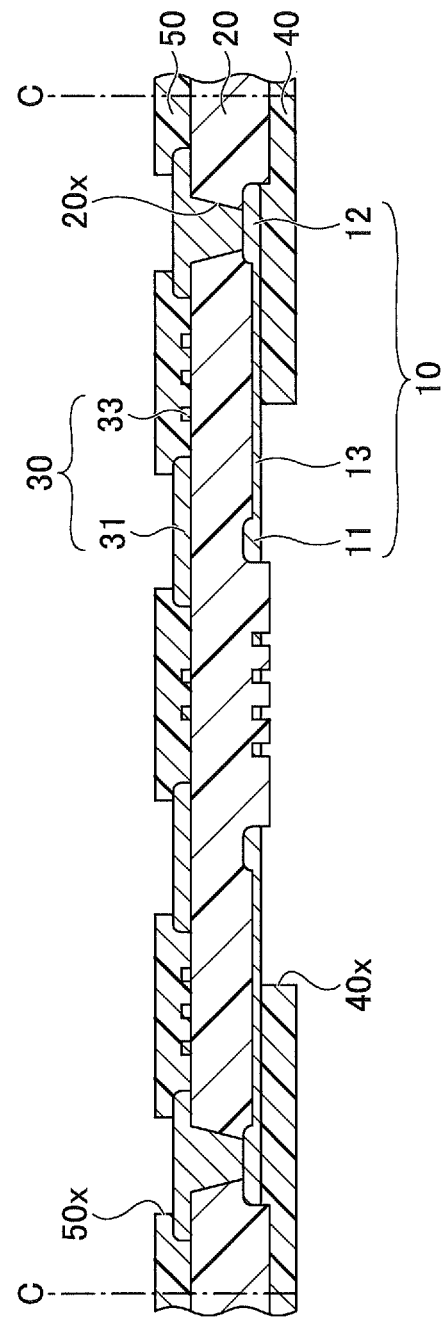

Next, in a step illustrated in FIG. 6D, similar to the step illustrated in FIG. 4C, the solder resist layer 40 that convers the wiring layer 10 is formed on the one surface of the insulating layer 20. Further, the solder resist layer 50 that convers the wiring layer 30 is formed on the other surface of the insulating layer 20. After the step illustrated in FIG. 6D, a structural body illustrated in FIG. 6D is cut at cut positions C by a slicer or the like to be individualized, and a plurality of the wiring boards 1 are completed. Here, different from the structure illustrated in FIG. 1A and FIG. 1B, the upper surface of the wiring layer 10 is positioned to be concaved from the upper surface of the insulating layer 20.

Alternative Example 2 of First Embodiment

In an alternative example 2 of the first embodiment, yet another example of the method of manufacturing the wiring board 1 is described. In the alternative example 2 of the first embodiment, for the same components that are already described above, descriptions are sometimes not repeated.

FIG. 7A to FIG. 7D are views illustrating an example of the method of manufacturing the wiring board of the alternative example 2 of the first embodiment. In the alternative example 2 of the first embodiment, a support body 300A in which a metal foil with a carrier 320A is stacked on the pre-preg 310 is used. The metal foil with a carrier 320A has a structure in which a thin foil 321A made of nickel with a thickness of about 1.5 to 5 μm is detachably stuck on a thick foil (carrier foil) 322 made of copper with a thickness of about 10 to 50 μm through a peeling layer (not illustrated in the drawings). Here, as the thin foil 321A functions as an etching stop layer, the barrier layer 330 is not formed on the support body 300A.

Figure 7A:
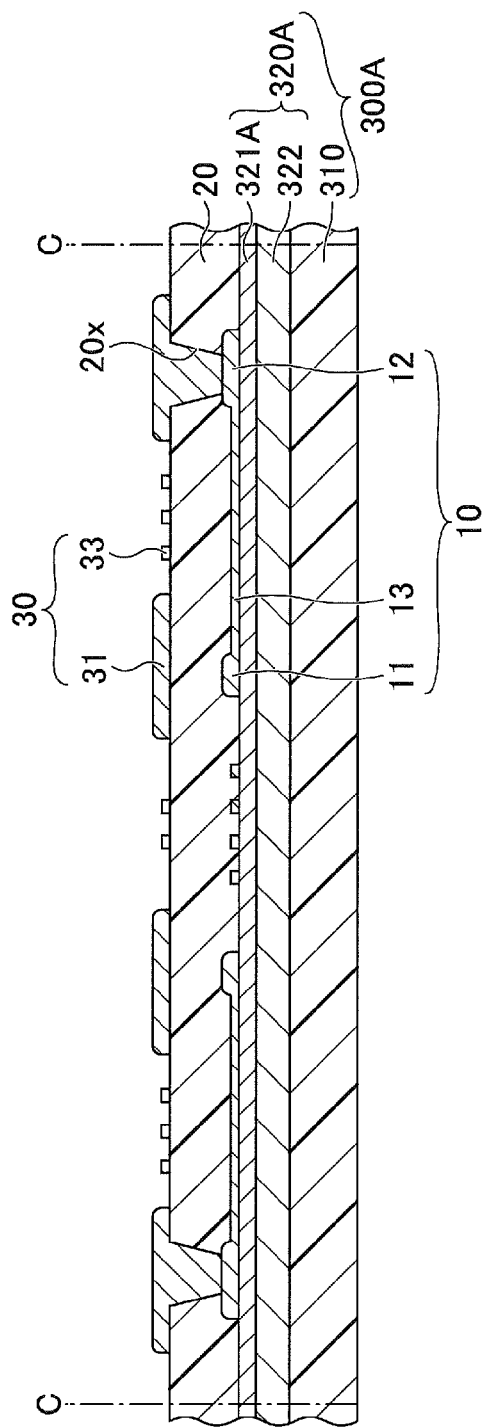
FIG. 7A to FIG. 7D are views illustrating an example of the manufacturing steps of the wiring board of an alternative example 2 of the first embodiment.
Figure 7B:
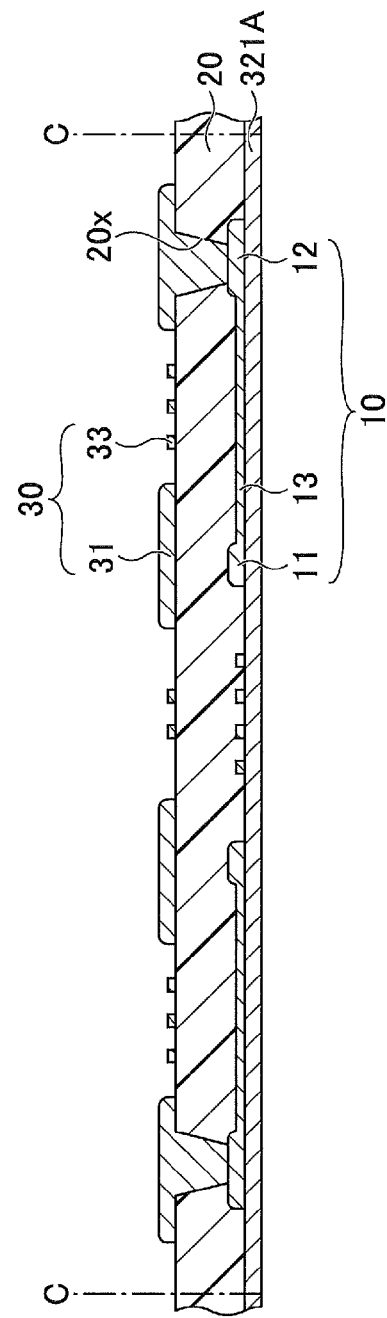

First, in a step illustrated in FIG. 7A, similar to the step illustrated in FIG. 2A, after manufacturing the support body 300A, steps similar to FIG. 2C to FIG. 3C are performed, and the wiring layer 10, the insulating layer 20 and the wiring layer 30 are directly stacked on the support body 300A. Next, in a step illustrated in FIG. 7B, similar to the step illustrated in FIG. 3D, the pre-preg 310 and the thick foil 322 that compose the support body 300A is peeled from a structural body illustrated in FIG. 7A. With this, only the thin foil 321A is left at the insulating layer 20 side, and other members (the pre-preg 310 and the thick foil 322) that compose the support body 300A are removed.

Figure 7C:
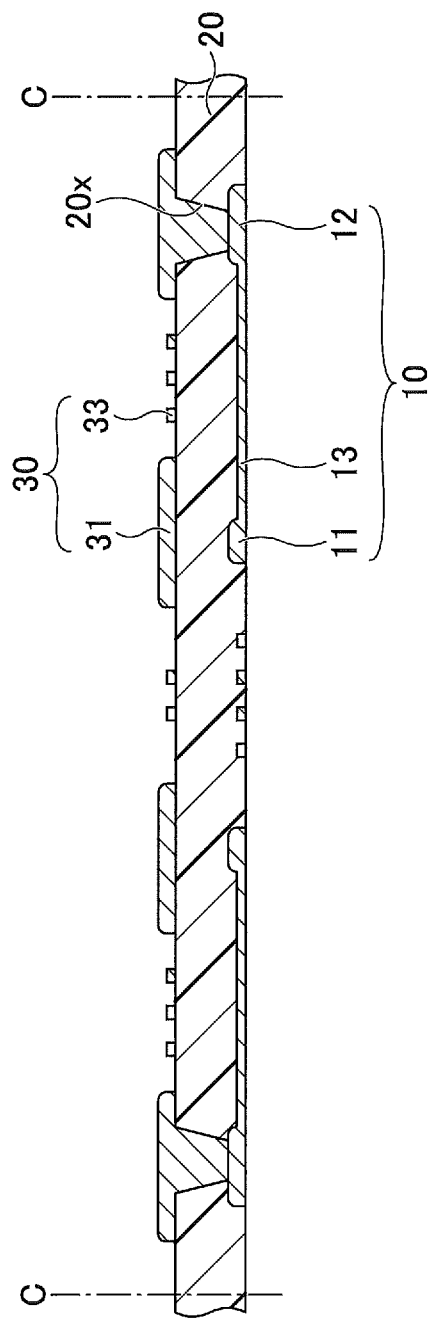

Next, in a step illustrated in FIG. 7C, the thin foil 321A (see FIG. 7B) made of nickel is removed by etching. By selectively using etchant that does not remove copper but remove nickel (Ni), only the thin foil 321A is etched without etching the wiring layer 10. With this, the one surface of the wiring layer 10 is exposed at the one surface of the insulating layer 20. The one surface of the wiring layer 10 may be flush with the one surface of the insulating layer 20, for example.

Figure 7D:
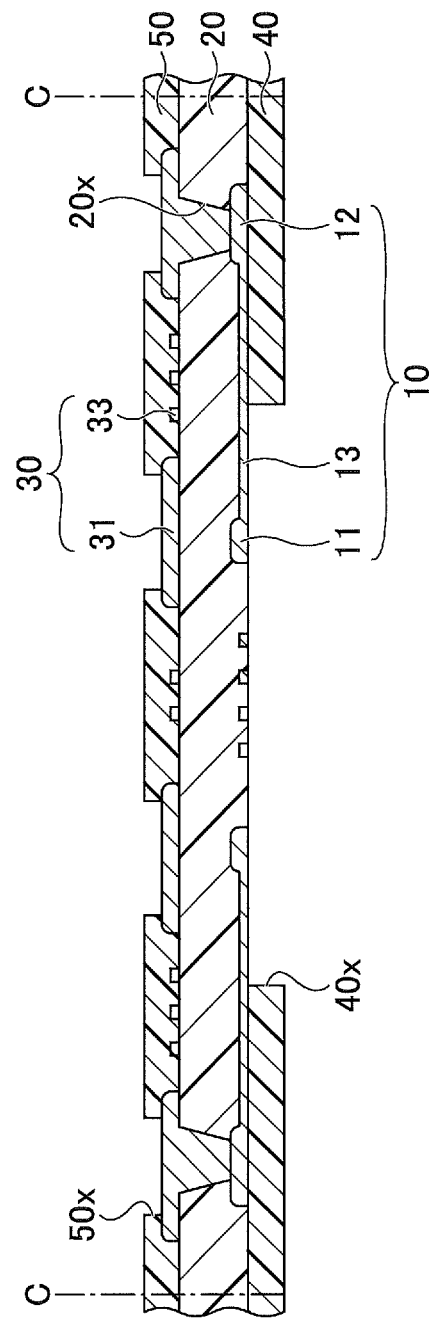

Next, in a step illustrated in FIG. 7D, similar to the step illustrated in FIG. 4C, the solder resist layer 40 that covers the wiring layer 10 is formed on the one surface of the insulating layer 20. Further, the solder resist layer 50 that covers the wiring layer 30 is formed on the other surface of the insulating layer 20. After the step illustrated in FIG. 7D, a structural body illustrated in FIG. 7D is cut at cut positions C by a slicer or the like to be individualized, and a plurality of the wiring boards 1 (see FIG. 1A and FIG. 1B) are completed.

Second Embodiment

In a second embodiment, an example of the wiring board having a three layered structure is described. In the second embodiment, for the same components that are already described above, descriptions are sometimes not repeated.

Figure 8:
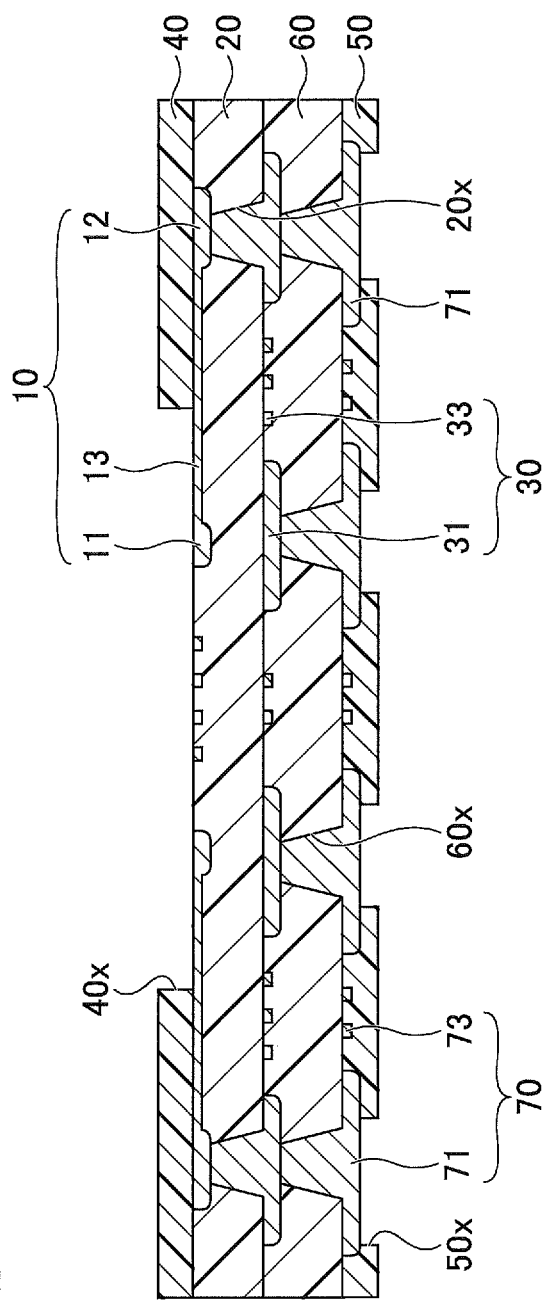
FIG. 8 is a cross-sectional view illustrating an example of the wiring board of a second embodiment.

FIG. 8 is a cross-sectional view illustrating an example of a wiring board 2 of the second embodiment. With reference to FIG. 8, the wiring board 2 of the second embodiment is different from the wiring board 1 (see FIG. 1A and FIG. 1B) in that an insulating layer 60 and a wiring layer 70 are inserted between the wiring layer 30 and the solder resist layer 50.

The insulating layer 60 is formed at the lower surface of the insulating layer 20 so as to cover the wiring layer 30. The material and the thickness of the insulating layer 60, and the method of forming the insulating layer 60 may be the same as those of the insulating layer 20, for example.

The wiring layer 70 is formed at a lower surface of the insulating layer 60. The material of the wiring layer 70 and the method of forming the wiring layer 70 may be the same as those of the wiring layer 30, for example. The wiring layer 70 includes pads for external connection 71 that are connected to another wiring board or the like, and wiring patterns 73. The pads 71 may be connected to the wiring patterns 73. Each of the pads 71 may be connected to the respective pad 31 through a via wiring that is filled in a via hole 60x that penetrates the insulating layer 60 and exposes the lower surface of the respective pad 31. Each of the via holes 60x is a concave portion having a cone trapezoid shape where the diameter of an open portion at a solder resist layer 50 side is larger than the diameter of a bottom surface of an open portion formed by the lower surface of the pad 31. The pad 71 and the via wiring in the via hole 60x are integrally formed.

The pads 71 are the wide portions (fourth portion), and the width of the pad 71 may be about 150 µm, for example. The thickness of the pad 71 may be about 15 µm, for example. The wiring patterns 73 (third portion) are the narrow portions, and the width of the wiring pattern 73 may be about 10 µm, for example. Further, the thickness of the wiring pattern 73 may be about 12 µm, for example.

The solder resist layer 50 is provided with open portions 50x and the lower surfaces of the pads 71 of the wiring layer 70 are exposed at the bottom portions of the open portions 50x, respectively. In accordance with necessity, the above described metal layer may be formed on the lower surface of the pads 71 that are exposed at the open portions 50x. Further, instead of forming the metal layer, an antioxidation process such as an OSP process or the like may be performed.

As such, by forming the insulating layer 60 and the wiring layer 70 between the wiring layer 30 and the solder resist layer 50, the wiring board 2 having the tree layered structure can be actualized. The insulating layer 60 and the wiring layer 70 may be formed by the similar method as the insulating layer 20 and the wiring layer 30, for example. A wiring board having a four or more layered structure may be formed by forming the necessary numbers of insulating layers and wiring layers between the wiring layer 30 and the solder resist layer 50.

(Applied Example 1 of Wiring Board)

In an applied example 1 of the wiring board, an example of a semiconductor package is described in which a semiconductor chip is mounted (flip-chip mounted) on the wiring board 1 of the first embodiment. In the applied example 1 of the wiring board, for the same components that are already described above, descriptions are sometimes not repeated.

Figure 9A:
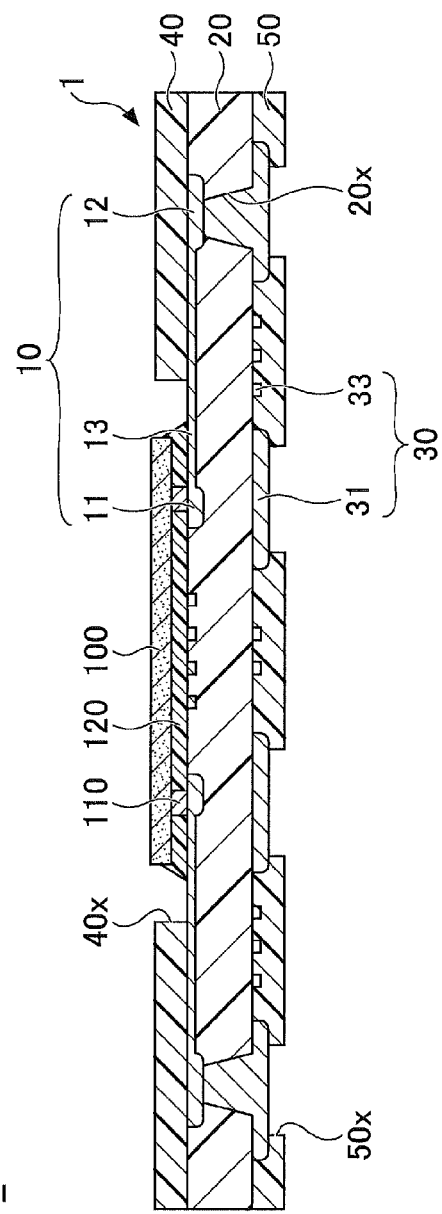
FIG. 9A and FIG. 9B are cross-sectional views illustrating an example of a semiconductor package of an applied example 1.
Figure 9B:
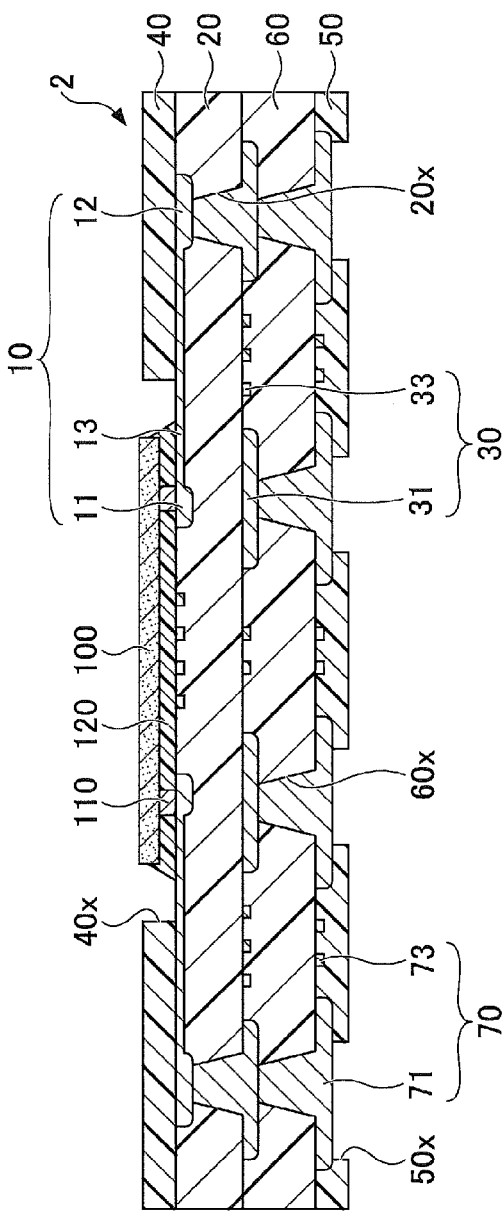

FIG. 9A and FIG. 9B are cross-sectional views illustrating an example of a semiconductor package of the applied example 1. With reference to FIG. 9A, a semiconductor package 3 includes the wiring board 1 illustrated in FIG. 1A and FIG. 1B, a semiconductor chip 100, bumps 110 and underfill resin 120. In the semiconductor package 3, the solder resist layer 40 side of the wiring board 1 is a chip mounting surface on which the semiconductor chip 100 is mounted, and the solder resist layer 50 side of the wiring board 1 is a terminal for external connection surface on which terminals for external connection are formed.

The semiconductor chip 100 has a structure in which a semiconductor integrated circuit (not illustrated in the drawings) or the like is formed on a thinned semiconductor substrate (not illustrated in the drawings) made of silicon or the like, for example. Electrode pads (not illustrated in the drawings) electrically connected to the semiconductor integrated circuit (not illustrated in the drawings) are formed on the semiconductor substrate (not illustrated in the drawings).

The bumps 110 electrically connect the electrode pads (not illustrated in the drawings) of the semiconductor chip 100 and the pads 11 of the wiring layer 10 that are exposed from the open portion 40x of the solder resist layer 40 of the wiring board 1. The bumps 110 are solder bumps, for example. For the material of the solder bumps, alloy including Pb, alloy of Sn and Cu, alloy of Sn and Ag, alloy of Sn, Ag and Cu or the like may be used. The underfill resin 120 is filled between the semiconductor chip 100 and the wiring board 1 (insulating layer 20).

As such, by mounting the semiconductor chip 100 on the wiring board 1 of the first embodiment, the semiconductor package 3 can be actualized. Further, as illustrated in FIG. 9B, the semiconductor package 4 may be actualized by mounting the semiconductor chip 100 on the wiring board 2 of the second embodiment.

Here, there may be a case in which the pads 11 include a plurality of kinds of pads whose width are different from each other. In such a case, although the pads with different widths have different thicknesses (the wider the width is, the thicker the thickness becomes), surfaces of the pads 11 at which the semiconductor chip 100 is mounted are flush with each other. Thus, even when the thicknesses of the pads 11 are different, a gap between each of the pads 11 and each of the electrode pads of the semiconductor chip 100 becomes constant, and it is easy to connect each of the pads 11 and each of the electrode pads of the semiconductor chip 100.

(Applied Example 2 of Wiring Board)

In an applied example 2 of the wiring board, an example of a semiconductor package having a so-called Package on package (POP) structure in which yet another semiconductor package is mounted on the semiconductor package. In the applied example 2 of the wiring board, for the same components that are already described above, descriptions are sometimes not repeated.

Figure 10:
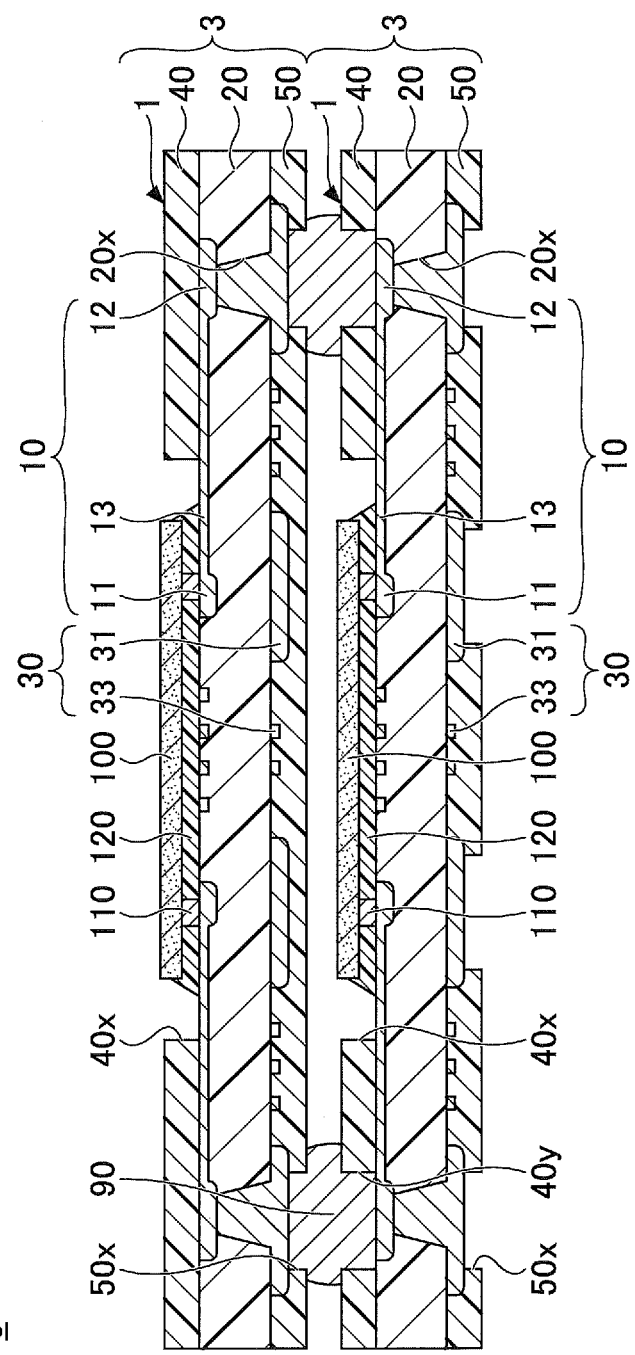
FIG. 10 is a cross-sectional view illustrating an example of the semiconductor package of an applied example 2.

FIG. 10 is a cross-sectional view illustrating an example of a semiconductor package of the applied example 2. With reference to FIG. 10, a semiconductor package 5 has a structure in which yet another semiconductor package 3 is mounted on the semiconductor package 3.

Here, open portions 40y that expose the upper surface of the pads 12 are further provided in the solder resist layer 40 of the wiring board 1 in the lower side semiconductor package 3. Then, the pad that is exposed in the open portion 40y of the solder resist layer 40 of the lower semiconductor package 3 and the pad 31 that is exposed in the open portion 50x of the solder resist layer 50 of the upper semiconductor package 3 are connected through a bump 90. For the bump 90, a solder ball having a structure in which a copper core ball is covered by solder may be used, for example.

As such, the semiconductor package 5 having the POP structure can be actualized by using the wiring board 1 of the first embodiment. Here, instead of the wiring board 1, the wiring board 2 may be used.

Example 1

Thicknesses of formed plated wirings were observed for a portion at which the width of a wiring is narrow (referred to as a fine line portion) and a portion at which the width of a wiring is wide (referred to as a "rough line portion") by changing conditions of electrolyte copper plating.

Here, line pace of the fine line portion was set as 10 μm/10 μm, and line/space of the rough line portion was set as 25 μm/25 μm.

First, a resist layer provided with open portions for forming the fine line portion whose line/space was 10 μm/10 μm and the rough line portion whose line/space was 25 μm/25 μm was formed on a substrate on which a conductive layer is provided.

Next, electrolyte copper plating solution whose concentration ratio of copper sulfate and sulfuric acid was 1, and electrolyte copper plating solution whose concentration ratio of copper sulfate and sulfuric acid was 5 were prepared. Then, using each of the electrolyte copper plating solutions, electroplating was performed under a condition in which current density was 1.0 ASD (A/dm$^2$) and plating period was 60 minutes to deposit an electrolyte copper plating film in the open portions of the resist layer corresponding to the fine line portion and the rough line portion.

Further, as a comparative example 1, electrolyte copper plating solution whose concentration ratio of copper sulfate and sulfuric acid was 0.2 and electrolyte copper plating solution whose concentration ratio of copper sulfate and sulfuric acid was 5.5 were prepared. Then, similar to the example 1, using each of the electrolyte copper plating solutions, electroplating was performed under a condition in which current density was 1.0 ASD and plating period was 60 minutes to deposit an electrolyte copper plating film in the open portions of the resist layer corresponding to the fine line portion and the rough line portion.

Figure 11:
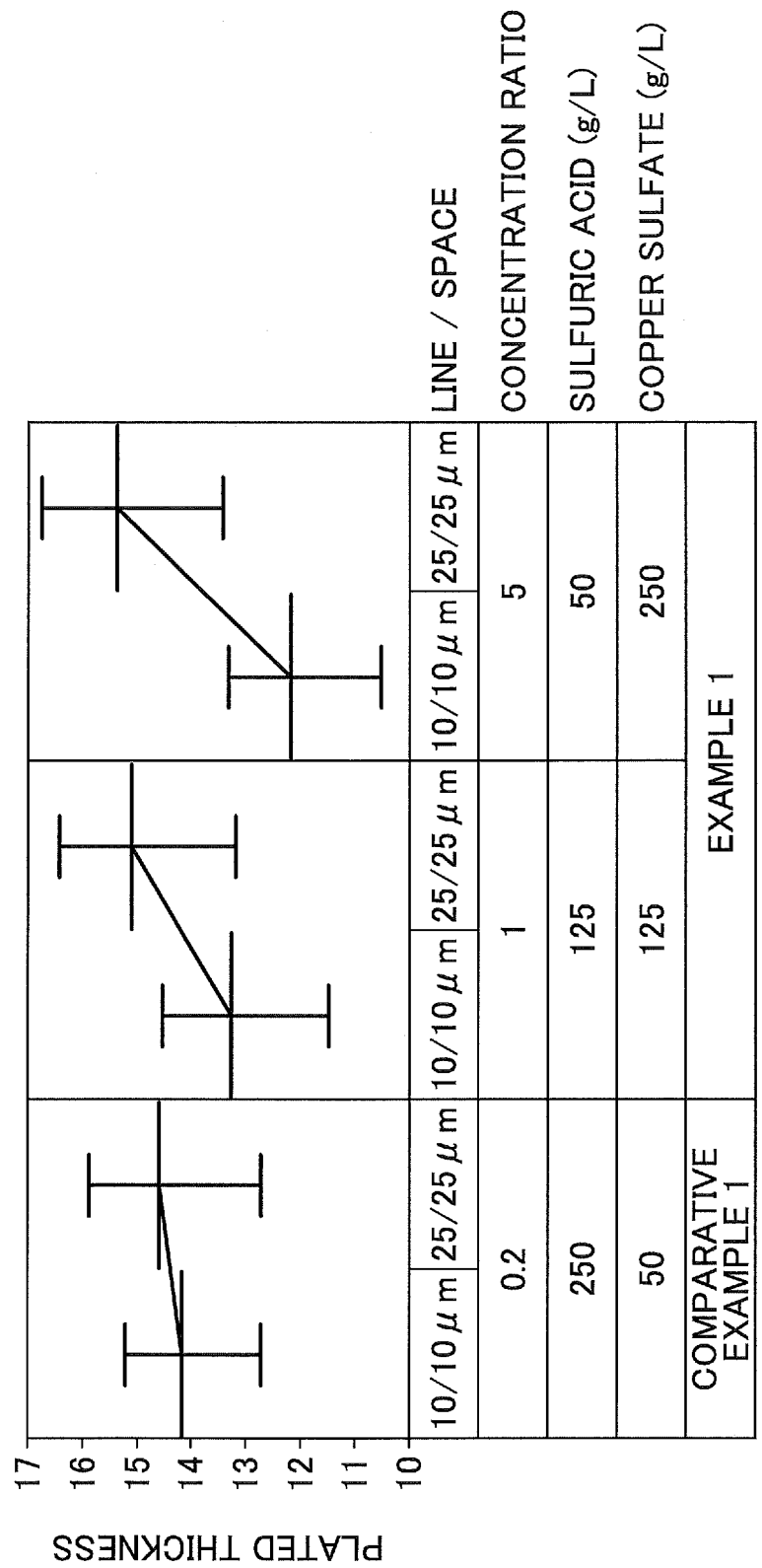
FIG. 11 is a view illustrating a result of example 1.

The result is illustrated in FIG. 11. As can be understood from FIG. 11, when the concentration ratio of copper sulfate and sulfuric acid was 1, the plated thickness of the fine line portion was about 13 μm as an average value, the plated thickness of the rough line portion was about 15 μm as an average value, and the difference between them was about 2 μm. Further, when the concentration ratio of copper sulfate and sulfuric acid was 5, the plated thickness of the fine line portion was about 12 μm as an average value, the plated thickness of the rough line portion was about 15.5 μm as an average value, and the difference between them was about 3.5 μm. This means that for both of the concentration ratios, a sufficient difference in the plated thickness, greater than or equal to 1 μm as an average value, between the fine line portion and the rough line portion could be obtained.

On the other hand, when the concentration ratio of copper sulfate and sulfuric acid was 0.2 in the comparative example 1, the plated thickness of the fine line portion was about as 14 μm as an average value, the plated thickness of the rough line portion was about 14.5 μm as an average value, and the difference between them was about 0.5 μm. Further, when the concentration ratio of copper sulfate and sulfuric acid was 0.2 in the comparative example 1, abnormal deposition of electrolyte copper plating occurred due to insufficient supply of copper ions. Here, when the concentration ratio of copper sulfate and sulfuric acid was 5.5 in the comparative example 1, abnormal deposition of electrolyte copper plating occurred due to excessive supply of copper ions, and the plated thickness could not be measured. Thus, the result is not illustrated in FIG. 11.

As such, it is preferable that the concentration ratio of copper sulfate and sulfuric acid is greater than 0.2 and less than or equal to 5 because quality of the electrolyte copper plating film cannot be ensured when the concentration ratio of copper sulfate and sulfuric acid is less than or equal to 0.2 or greater than or equal to 5.5. Further, it is particularly preferable that the concentration ratio of copper sulfate and sulfuric acid is within a range greater than or equal to 1 and less than or equal to 5 by which a significant difference in the plated thickness, greater than or equal to 1 μm as an average value, between the fine line portion and the rough line portion can be obtained.

Example 2

Using electrolyte copper plating solution whose concentration ratio of copper sulfate and sulfuric acid was 1, electroplating was performed by changing the current density (plating period was 60 minutes) to deposit an electrolyte copper plating film in the open portions of the resist layer corresponding to the fine line portion and the rough line portion. Here, other conditions were the same as those of the example 1.

Figure 12:
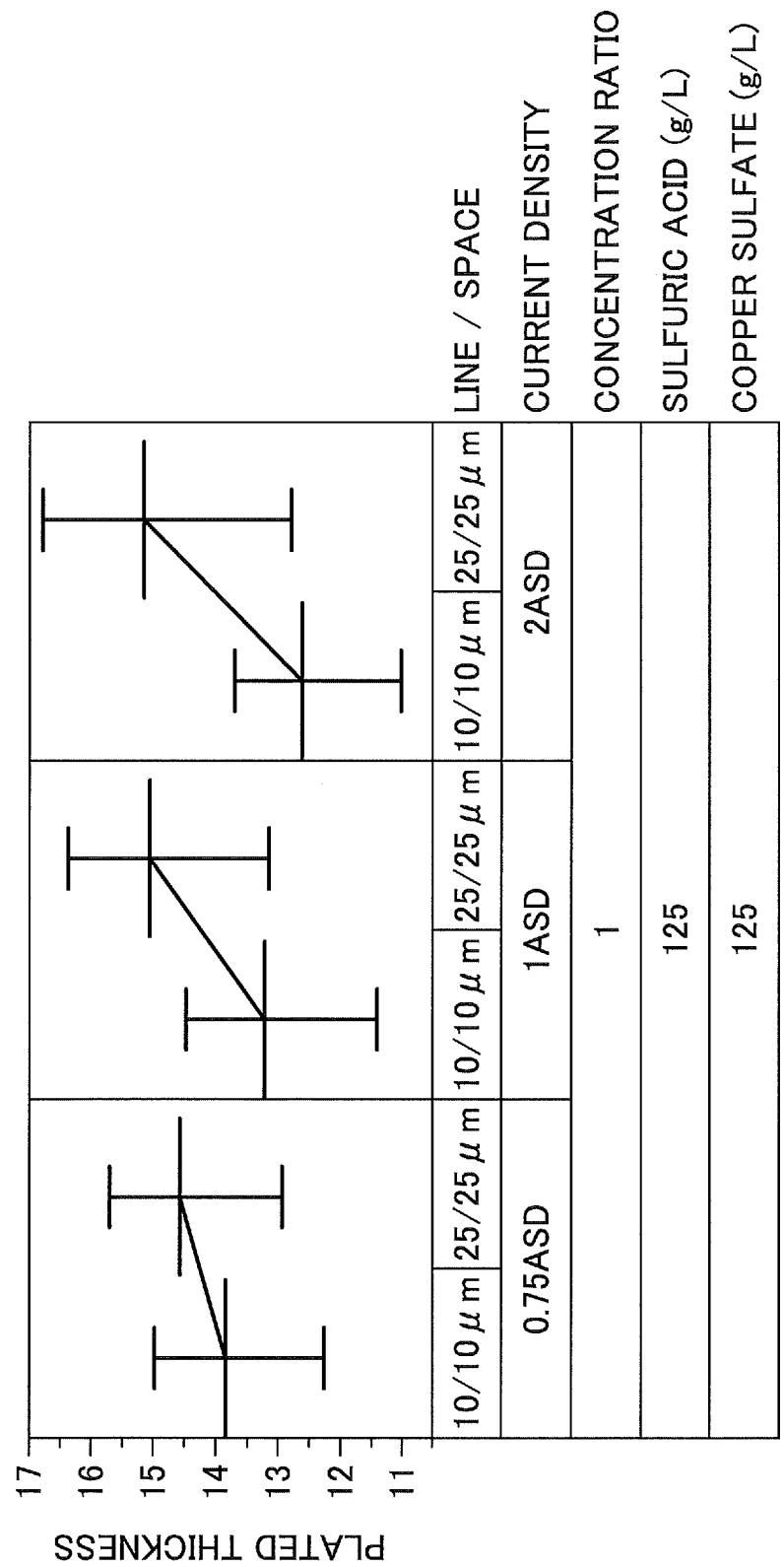
FIG. 12 is a view illustrating a result of example 2.

The result is illustrated in FIG. 12. As can be understood from FIG. 12, when the current density was 0.75 ASD, the plated thickness of the fine line portion was about 13.8 μm as an average value, the plated thickness of the rough line portion was about 14.5 μm as an average value, and the difference between them was about 0.7 μm. Further, when the current density was 1 ASD, the plated thickness of the fine line portion was about 13 μm as an average value, the plated thickness of the rough line portion was about 15 μm as an average value, and the difference between them was about 2 μm. Further, when the current density was 2 ASD, the plated thickness of the fine line portion was about 12.5 μm as an average value, the plated thickness of the rough line portion was about 15.5 μm as an average value, and the difference between them was about 3 μm. Here, when the current density was 2.5 ASD, quality of the electrolyte copper plating film was not ensured because burning occurred.

As such, it is preferable that the current density is greater than 0.75 ASD and less than or equal to 2 ASD by which quality of the electrolyte copper plating film can be ensured. Further, it is particularly preferable that the current density is within a range greater than or equal to 1 ASD and less than or equal to 2 ASD by which a significant difference in the plated thickness, greater than or equal to 1 μm as an average value, between the fine line portion and the rough line portion can be obtained. Here, for cases of other concentration ratios (when the concentration ratio of copper sulfate and sulfuric acid was 5, for example), the same results were obtained. In other words, when the current density is greater than or equal to 1 ASD and less than or equal to 2 ASD, a significant difference in the plated thickness, greater than or equal to 1 μm as an average value, between the fine line portion and the rough line portion was obtained.

Example 3

Samples were manufactured in which the aspect ratio of the resist layer was changed from 1 to 4 with 0.5 intervals. Then, using electrolyte copper plating solution whose concentration ratio of copper sulfate and sulfuric acid was 5, electroplating for each of the resist layers of different aspect ratios was performed under a condition in which current density was 1.0 ASD and plating period was 60 minutes. Thereafter, the resist layer was peeled and percent defective of defect in peeling was measured.

Further, as a comparative example 2, using electrolyte copper plating solution whose concentration ratio of copper sulfate and sulfuric acid was less than 0.2, electroplating for each of the resist layers of different aspect ratios was performed under a condition in which current density was 1.0 ASD and plating period was 60 minutes. Thereafter, the resist layer was peeled and percent defective of defect in peeling was measured.

Figure 13:
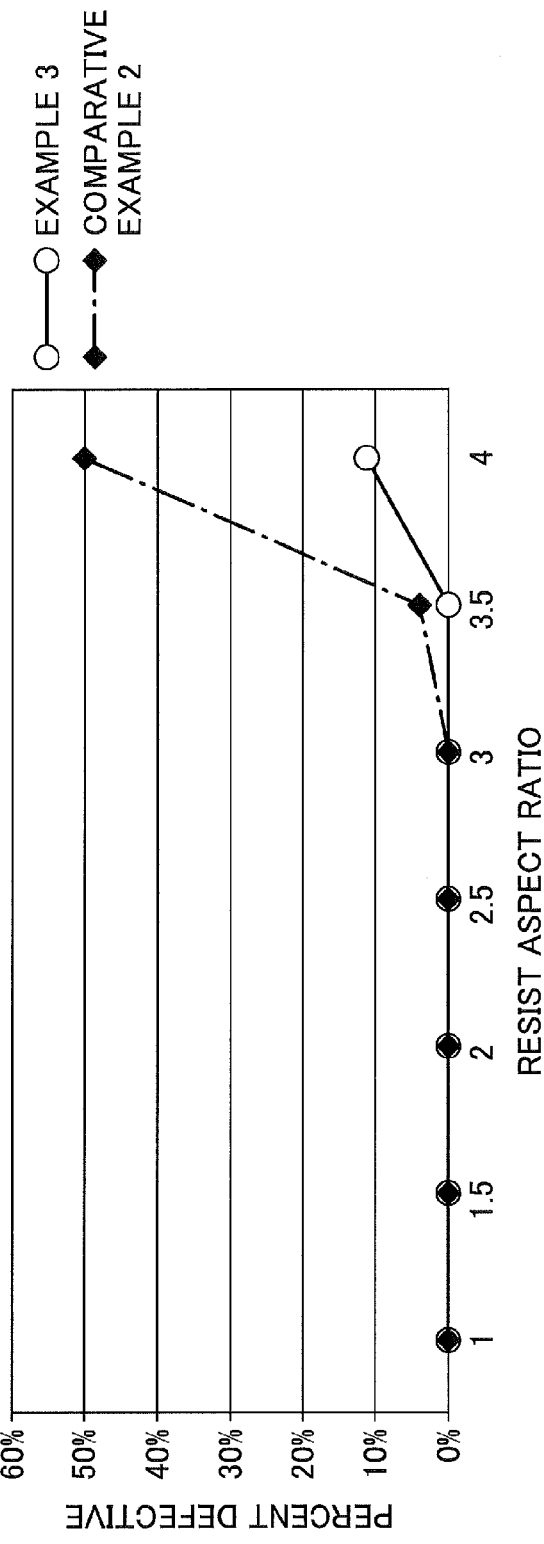
FIG. 13 is a view illustrating a result of example 3.

The result is illustrated in FIG. 13. As can be understood from FIG. 13, in the example 3, the percent defective was 0% when the aspect ratio of the resist layer was up to 3.5, and the percent defective was about 10% when the aspect ratio of the resist layer was 4. On the other hand, in the comparative example 2, when the aspect ratio of the resist layer was 3.5, the percent defective was about 5%, and when the aspect ratio of the resist layer was 4, the percent defective was about 50%.

As such, it was confirmed that percent defective of defect in peeling can be largely reduced by making the plated thickness thinner at a portion whose aspect ratio of the resist layer is high (in other words, fine line portion).

Example 4

Electrolyte copper plating solution whose concentration ratio of copper sulfate and sulfuric acid was 5 was prepared. Then, using this electrolyte copper plating solution, electroplating in which current density was 1.0 ASD and plating period was 60 minutes was performed to deposit an electrolyte copper plating film in the open portions of the resist layer corresponding to the rough line portion. After peeling the resist layer, solder balls were reflowed on the rough line portions and a status after being left for 3,000 hours was obtained by a microscope.

Further, as a comparative example 3, electrolyte copper plating solution whose concentration ratio of copper sulfate and sulfuric acid was less than 0.2 was prepared. Then, using this electrolyte copper plating solution, electroplating was performed under a condition in which current density was 1.0 ASD and plating period was 60 minutes to deposit an electrolyte copper plating film in the open portions of the resist layer corresponding to the rough line portions. After peeling the resist layer, solder balls were reflowed on the rough line portions and a status after being left for 3,000 hours was obtained by a microscope.

Figure 14:
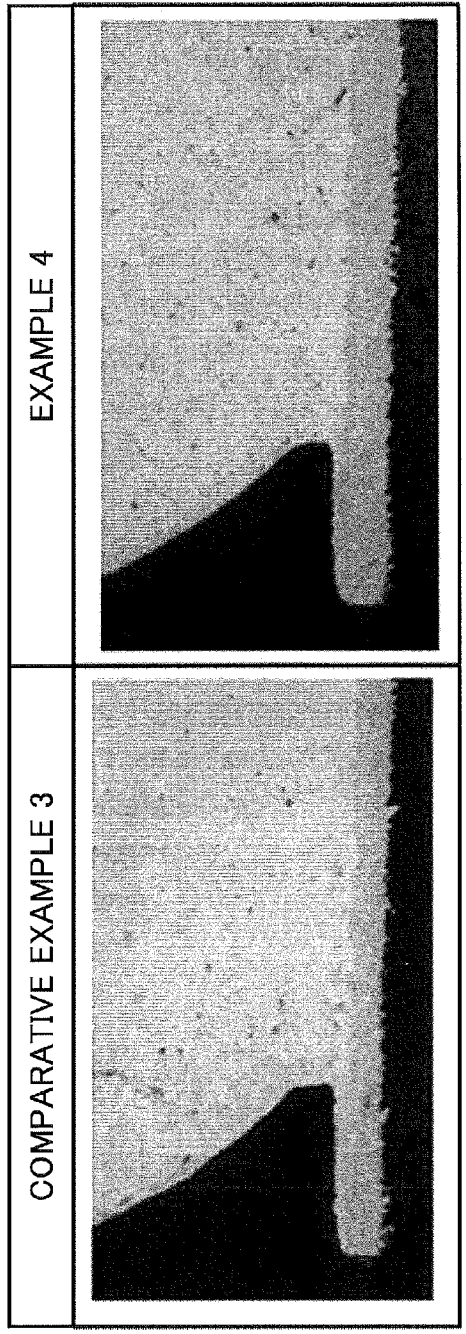
FIG. 14 is a view illustrating a result of example 4.

The result is illustrated in FIG. 14. As can be understood from FIG. 14, in both of the example 4 and the comparative example 3, by leaving after reflowing, as alloy is formed at a connecting portion of solder and copper, the plated thickness right below the solder ball becomes thinner. However, as the original plated thickness is thicker in the example 4 compared with that in the comparative example 3, the plated thickness right below the solder ball is sufficiently ensured even after being left for 3,000 hours.

As such, not only making the plated thickness of the fine line portion thin, but connection reliability with solder can also be improved by making the plated thickness of the rough line portion thicker, compared with a conventional one.

According to the embodiments, a wiring board in which defect in peeling of a resist layer hardly occurs can be provided.

Although a preferred embodiment of the wiring board has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, although the wiring pattern of the wiring layer is exemplified as the narrow portion and the pad of the wiring layer is exemplified as the wide portion in the above described embodiments, this is not limited so. For example, as an example of the wide portion, a plane layer of a power source or ground may be used. Further, wiring patterns whose widths are narrow and wiring patterns whose widths are wide may be mixed in the wiring patterns.

Further, the wiring board including the plurality of wiring layers may include a wiring layer in which the thicknesses of the narrow portion and the wide portion are substantially the same, as a part.

Further, in the method of manufacturing the wiring board, the metal foil with a carrier 320 or 320A may be stacked on both surfaces of the pre-preg 310 to form a support body, and the wiring board may be formed at both surfaces of the support body.

Various aspects of the subject-matter described herein are set out non-exhaustively in the following numbered clauses:

1. A method of manufacturing a wiring board including:
forming a wiring layer including a first portion and a second portion whose width is wider than that of the first portion such that the first portion is thinner than the second portion by depositing plating on a support body; and
forming an insulating layer that covers the first portion and the second portion on the support body.

2. The method of manufacturing the wiring board according to clause 1, wherein in the forming the wiring layer, the first portion and the second portion are formed by copper plating by electroplating using electrolyte copper plating solution prepared with a predetermined concentration ratio of copper sulfate and sulfuric acid such that the thickness of the first portion becomes thinner than the thickness of the second portion by previously adjusting the predetermined concentration ratio.

3. The method of manufacturing the wiring board according to clause 2, wherein the predetermined concentration ratio is within a range greater than or equal to 1 and less than or equal to 5.

What is claimed is:

1. A wiring board comprising:
an insulating layer;
a first wiring layer embedded in the insulating layer at one surface side of the insulating layer,
one surface of the first wiring layer being exposed from one surface of the insulating layer,
the first wiring layer including a first portion and a second portion whose width is wider than that of the first portion,
one surface of the first portion and one surface of the second portion being flush with each other, and
the first portion being thinner than the second portion; and
a second wiring layer that is formed at another surface side of the insulating layer,
the second wiring layer including a third portion and a fourth portion whose width is wider than that of the third portion, and
the third portion being thinner than the fourth portion.

2. The wiring board according to claim 1,
wherein the one surface of the first portion is exposed from the one surface of the insulating layer, and another surface and a side surface of the first portion is covered by the insulating layer, and
wherein the one surface of the second portion is exposed from the one surface of the insulating layer, and another surface and a side surface of the second portion is covered by the insulating layer.

3. The wiring board according to claim 1,
wherein the first portion is a wiring pattern and the second portion is a pad.

4. The wiring board according to claim 3,
wherein the pad is a pad for receiving a via, and an end portion of a via wiring that penetrates the insulating layer is connected to another surface of the pad.

5. The wiring board according to claim 3,
wherein the pad is a pad for external connection to be connected to a semiconductor chip.

6. The wiring board according to claim 1,
wherein the one surface of the first portion and the one surface of the second portion are exposed at position that is concaved from the one surface of the insulating layer.

7. A wiring board comprising:
an insulating layer; and
a first wiring layer embedded in the insulating layer at one surface side of the insulating layer,
one surface of the first wiring layer being exposed from one surface of the insulating layer,
the first wiring layer including a first portion and a second portion whose width is wider than that of the first portion,
one surface of the first portion and one surface of the second portion being flush with each other, and
the first portion being thinner than the second portion,
wherein the first portion is a wiring pattern and the second portion is a pad, and
wherein the pad is a pad for receiving a via, and an end portion of a via wiring that penetrates the insulating layer is connected to another surface of the pad.

8. The wiring board according to claim 7,
wherein the one surface of the first portion is exposed from the one surface of the insulating layer, and another surface and a side surface of the first portion is covered by the insulating layer, and
wherein the one surface of the second portion is exposed from the one surface of the insulating layer, and another surface and a side surface of the second portion is covered by the insulating layer.

9. The wiring board according to claim 7,
wherein the one surface of the first portion and the one surface of the second portion are exposed at position that is concaved from the one surface of the insulating layer.

10. The wiring board according to claim 7, further comprising:
a second wiring layer that is formed at another surface side of the insulating layer,
wherein the second wiring layer is electrically connected to the pad for receiving a via of the first wiring layer through the via wiring that penetrates the insulating layer.

11. The wiring board according to claim 7,
wherein the second portion further includes a pad for external connection to be connected to a semiconductor chip.

12. The wiring board according to claim 7,
wherein the second portion further includes a pad for external connection to be connected to a semiconductor package.

13. The wiring board according to claim 7, further comprising:
a solder resist layer formed on the one surface of the insulating layer and the one surface of the first wiring layer,
wherein the second portion further includes a pad for external connection, and
wherein the solder resist layer is provided with an open portion that exposes one surface of the pad for external connection.

14. A wiring board comprising:
an insulating layer; and
a first wiring layer embedded in the insulating layer at one surface side of the insulating layer, one surface of the first wiring layer being exposed from one surface of the insulating layer, the first wiring layer including a first portion and a second portion whose width is wider than that of the first portion, one surface of the first portion and one surface of the second portion being flush with each other, and the first portion being thinner than the second portion, wherein the first portion is a wiring pattern and the second portion is a pad, and wherein the one surface of the first portion and the one surface of the second portion are exposed at position that is concaved from the one surface of the insulating layer.

15. The wiring board according to claim 14, wherein the one surface of the first portion is exposed from the one surface of the insulating layer, and another surface and a side surface of the first portion is covered by the insulating layer, and wherein the one surface of the second portion is exposed from the one surface of the insulating layer, and another surface and a side surface of the second portion is covered by the insulating layer.

16. The wiring board according to claim 14, further comprising:

a second wiring layer that is formed at another surface side of the insulating layer, wherein the pad is a pad for receiving a via, and an end portion of a via wiring that penetrates the insulating layer is connected to another surface of the pad, and wherein the second wiring layer is electrically connected to the pad for receiving a via of the first wiring layer through the via wiring that penetrates the insulating layer.

17. The wiring board according to claim 14, wherein the second portion further includes a pad for external connection to be connected to a semiconductor chip.

18. The wiring board according to claim 14, wherein the second portion further includes a pad for external connection to be connected to a semiconductor package.

19. The wiring board according to claim 14, further comprising:

a solder resist layer formed on the one surface of the insulating layer and the one surface of the first wiring layer, wherein the second portion further includes a pad for external connection, and wherein the solder resist layer is provided with an open portion that exposes one surface of the pad for external connection.

\* \* \* \* \*